United States Patent
Son et al.

(10) Patent No.: US 10,482,938 B2
(45) Date of Patent: Nov. 19, 2019

(54) WORD-LINE TIMING CONTROL IN A SEMICONDUCTOR MEMORY DEVICE AND A MEMORY SYSTEM INCLUDING THE SAME

(71) Applicant: SAMSUNG ELECTRONICS CO., LTD., Suwon-si, Gyeonggi-do (KR)

(72) Inventors: Jong-Pil Son, Seongnam-si (KR); Seong-Il O, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/691,985

(22) Filed: Aug. 31, 2017

(65) Prior Publication Data

US 2018/0122442 A1 May 3, 2018

(30) Foreign Application Priority Data

Nov. 3, 2016 (KR) .................. 10-2016-0145494

(51) Int. Cl.
  *G11C 8/08* (2006.01)
  *G11C 7/06* (2006.01)
  *G11C 7/12* (2006.01)
  *G11C 8/18* (2006.01)

(52) U.S. Cl.
  CPC ............. *G11C 8/08* (2013.01); *G11C 7/065* (2013.01); *G11C 7/12* (2013.01); *G11C 8/18* (2013.01)

(58) Field of Classification Search
  None
  See application file for complete search history.

(56) References Cited

U.S. PATENT DOCUMENTS

| | | | |
|---|---|---|---|
| 5,905,685 A | * | 5/1999 | Nakamura .......... G11C 11/4074 365/205 |
| 6,496,444 B2 | | 12/2002 | Roohparvar |
| 7,057,950 B2 | | 6/2006 | Lee |
| 7,616,510 B2 | | 11/2009 | Nakamura |
| 7,656,741 B2 | | 2/2010 | Lee et al. |
| 8,699,289 B2 | | 4/2014 | Kwon et al. |
| 9,286,967 B2 | | 3/2016 | Bell et al. |
| 9,335,951 B2 | | 5/2016 | Son et al. |

(Continued)

OTHER PUBLICATIONS

Micron SDR SDRAM MT48LCXXXX 128Mb x4 x8 x16 Datasheet, copyrighted 1999, revised Sep. 2014. (Year: 2014).*

*Primary Examiner* — J. H. Hur
(74) *Attorney, Agent, or Firm* — F. Chau & Associates, LLC

(57) ABSTRACT

A semiconductor memory device and method of operation that is capable of reducing disturbance of adjacent word lines. A memory cell array includes a plurality of memory cells coupled to a plurality of word-lines and a plurality of bit-lines. A first word-line, which is selected in response to an access address received from the memory controller, is enabled in response to a first command received from a memory controller, and the first word-line is disabled internally in the semiconductor memory device or in response to a disable command received from the memory controller after a reference time interval elapses. The reference time interval starts from a first time point when the first command is applied to the semiconductor memory device, and corresponds to a time interval equal to or greater than a row active time interval of the semiconductor memory device.

18 Claims, 23 Drawing Sheets

(56) References Cited

U.S. PATENT DOCUMENTS

| | | |
|---|---|---|
| 2009/0097349 A1* | 4/2009 | Lee .................. G11C 7/12 |
| | | 365/230.06 |
| 2009/0316504 A1 | 12/2009 | Choi |
| 2010/0128544 A1 | 5/2010 | Kim et al. |
| 2010/0142306 A1* | 6/2010 | Nakamura ............ G11C 5/145 |
| | | 365/227 |
| 2011/0158020 A1 | 6/2011 | Hwang |

* cited by examiner

310

WORD-LINE TIMING CONTROL IN A SEMICONDUCTOR MEMORY DEVICE AND A MEMORY SYSTEM INCLUDING THE SAME

CROSS-REFERENCE TO RELATED APPLICATION(S)

This US application claims the benefit of priority under 35 USC § 119 from Korean Patent Application No. 10-2016-0145494 on Nov. 3, 2016 in the Korean Intellectual Property Office, the contents of which are incorporated by reference herein.

TECHNICAL FIELD

Exemplary embodiments of the inventive concept relate to memory devices, and more particularly to semiconductor memory devices and methods of operating the same.

DISCUSSION OF THE RELATED ART

A high voltage may be applied to a word-line of a semiconductor memory device, such as a dynamic random access memory (DRAM), to enable a transistor to access a memory cell. However, an electric field that is generated by the high voltage may decrease a threshold voltage of an access transistor in an adjacent cell.

A degree of influence of an access to a memory cell on each of the other memory cells in DRAM is referred to as disturbance. When there is a wide gap between memory cells in a DRAM memory cell array, the disturbance is low. However, when the gap between memory cells is reduced, for example due to scaling, then interference, such as disturbance by an adjacent cell or line, increases.

SUMMARY

Some exemplary embodiments of the inventive concept may provide method of operating a semiconductor memory device, capable of reducing influence of disturbance.

Some exemplary embodiments of the inventive concept may provide a semiconductor memory device capable of reducing influence of disturbance.

According to exemplary embodiments of the inventive concept, a method of operating a semiconductor memory device including a memory cell array comprising a plurality of memory cells coupled to a plurality of word-lines and a plurality of bit-lines, a first word-line of the plurality of word-lines is enabled in response to a first command received from a memory controller (the first word-line is selected in response to an access address received from the memory controller), and the first word-line is disabled internally in the semiconductor memory device or in response to a disable command received from the memory controller after a reference time interval elapses (the reference time interval starts from a first time point when the first command is applied to the semiconductor memory device). The reference time interval may correspond to a time interval equal to or greater than a row active time (tRAS) interval of the semiconductor memory device.

According to exemplary embodiments of the inventive concept, a semiconductor memory device includes a memory cell array, a control logic circuit and a timing control circuit. The memory cell array includes a plurality memory cells coupled to a plurality of word-lines and a plurality of bit-lines. The control logic circuit controls access to the memory cell array in response to a command and an access address received from a memory controller. The timing control circuit generates first control signals to control voltage levels of the word-lines in response to operation control signals provided from the control logic circuit. The timing control circuit enables a first word-line of the plurality of word-lines in response to a first command received from the memory controller (the first word-line is selected in response to the access address) and disables the first word-line with a negative voltage lower than a ground voltage internally in the semiconductor memory device or in response to a disable command received from the memory controller after a reference time interval elapses. The reference time interval starts from a first time point when the first command is applied to the semiconductor memory device and the reference time interval corresponds to a time interval equal to or greater than a row active time (tRAS) interval of the semiconductor memory device.

In an embodiment of the inventive concept, a semiconductor device may include at least one semiconductor memory device having a memory cell array including a plurality of memory cells coupled to a plurality of word-lines and a plurality of bit-lines, in which the at least one semiconductor memory device includes a control logic circuit configured to disable internally at least a first word-line of the plurality of word-lines; a memory controller including a central processing unit, a command queue, and a command generator. The central processing unit is configured to monitor a status of the command queue, and control the command generator to apply a disable command to disable externally a first word-line of the at least one semiconductor memory device when a write command is not present in the command queue during a predetermined time interval after an active command is applied to the first word-line of the at least one semiconductor memory device.

The predetermined time interval may correspond to a time interval equal to or greater than a row active time (tRAS) interval of the semiconductor memory device.

The timing control circuit may be configured to generate first control signals to control voltage levels of the plurality of word-lines, and generate second control signals to control voltage levels of a bit-line pair of the plurality of bit lines coupled to the first word-line. The control logic circuit may be configured to control access to the memory cell array in response to a command and an access address received from the memory controller, and provide operation control signals to the timing control circuit.

In an embodiment of the inventive concept, the timing control circuit may be configured to apply a first voltage to the first word-line of the plurality of word-lines to enable the first word-line, and to apply a second voltage to disable the first word-line, wherein the second voltage comprises a negative voltage lower than a ground voltage.

Accordingly, the semiconductor memory device enables a selected word-line in response to an active command and may forcibly disable the selected word-line internally in the semiconductor memory device, or may disable the selected word line by a memory controller applying a disable command to the semiconductor memory device, when a successive command is not received from the memory controller during a reference time interval. Therefore, the influence of disturbance on adjacent word-lines due to enabling of the selected word-line may be reduced/prevented.

BRIEF DESCRIPTION OF THE DRAWINGS

Illustrative, non-limiting exemplary embodiments discussed herein will assist a person of ordinary skill in the art

DETAILED DESCRIPTION

Various exemplary embodiments of the inventive concept will be described more fully hereinafter with reference to the accompanying drawings.

Figure 1:
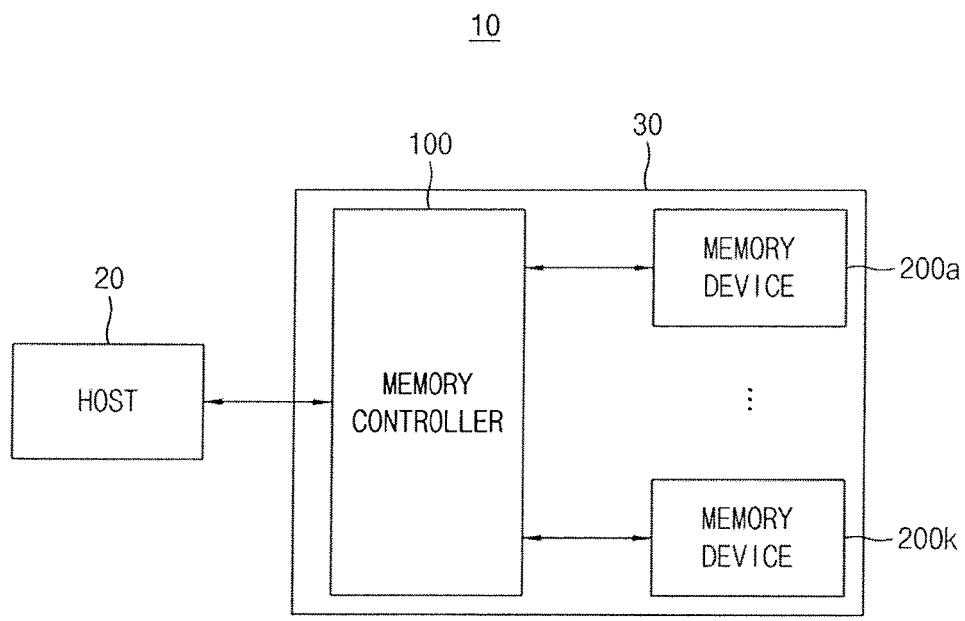
FIG. 1 is a block diagram illustrating an electronic system according to exemplary embodiments of the inventive concept.

FIG. 1 is a block diagram illustrating an electronic system according to exemplary embodiments.

Referring to FIG. 1, an electronic system 10 may include a host 20 and a memory system 30. The memory system 30 may include a memory controller 100 and a plurality of semiconductor memory devices 200a~200k.

The host 20 may communicate with the memory system 30 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 20 may also communicate with the memory system 30 through interface protocols such as Universal Serial Bus (USB), Multi-Media Card (MMC), Enhanced Small Disk Interface (ESDI), or Integrated Drive Electronics (IDE). A person of ordinary skill in the art should appreciate that the inventive concept is not limited to the aforementioned interface protocols.

The memory controller 100 may control an overall operation of the memory system 30. The memory controller 100 may control an overall data exchange between the host 20 and the plurality of semiconductor memory devices 200a~200k. For example, the memory controller 100 may write data in the plurality of semiconductor memory devices 200a~200k or read data from the plurality of semiconductor memory devices 200a~200k in response to a request from the host 20.

In addition, the memory controller 100 may issue operational commands to the plurality of semiconductor memory devices 200a~200k to control the plurality of semiconductor memory devices 200a~200k.

In some embodiments of the inventive concept, each of the plurality of semiconductor memory devices 200a~200k may be, for example, a dynamic random access memory (DRAM) including a plurality of dynamic memory cells. In other embodiments, each of the plurality of semiconductor memory devices 200a~200k may be a memory device including resistive-type memory cells such as a magnetoresistive random access memory (MRAM), a resistive random access memory (RRAM), a phase change random access memory (PRAM) and a ferroelectric random access memory (FRAM), etc.

Figure 2:
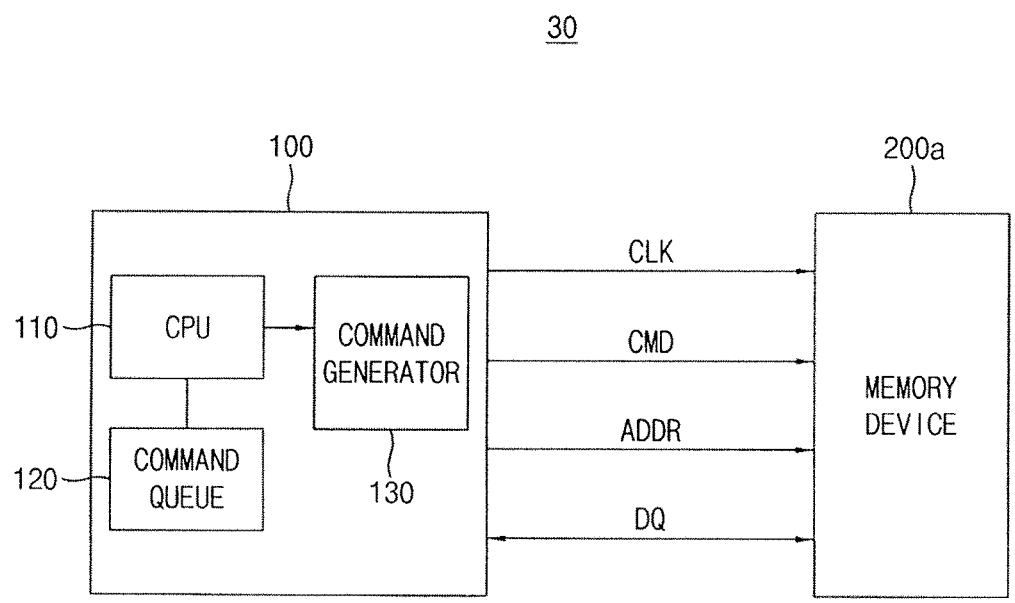
FIG. 2 is a block diagram illustrating an example of the memory system in FIG. 1 according to exemplary embodiments of the inventive concept.

FIG. 2 is a block diagram illustrating an example of the memory system in FIG. 1 according to exemplary embodiments.

In FIG. 2, only one semiconductor memory device 200a in communication with the memory controller 100 is illustrated for convenience. However, the details discussed herein related to semiconductor memory device 200a may apply to the other semiconductor memory devices 200b-200k.

Referring to FIG. 2, the memory system 30 may include, for example, the memory controller 100 and the semiconductor memory device 200a. Each of the memory controller 100 and the semiconductor memory device 200a may be formed as a separate semiconductor chip or as a separate group of chips (e.g., semiconductor memory device 200a may be a stack of semiconductor chips in a semiconductor package). The memory controller 100 may control the semiconductor memory device 200a by transmitting a clock signal CLK, a command CMD and an address ADDR to the semiconductor memory device 200a. The memory controller 100 may transmit data DQ to the semiconductor memory device 200a or receive the data DQ from the semiconductor memory device 200a.

The memory controller 100 may include, for example, a central processing unit (CPU) 110, a command queue 120 and a command generator 130. The CPU 110 controls an overall operation of the memory controller 100. The command queue 120 sequentially stores host commands received from the host 20. The command generator 130 generates the command CMD to be transmitted to the semiconductor memory device 200a under control of the CPU 110. The CPU 110 monitors status of the command queue 120 and controls the command generator 130, for example, to apply a disable command CMD to the semiconductor memory device 200a when a write command to be applied to the semiconductor memory device 200a does not exist (i.e. is not present) in the command queue 120 during a predetermined time interval after an active command is applied to the semiconductor memory device 200a. In response to receiving the disable command, the semiconductor memory device 200a may disable a word-line which is enabled in response to the active command.

Figure 3:
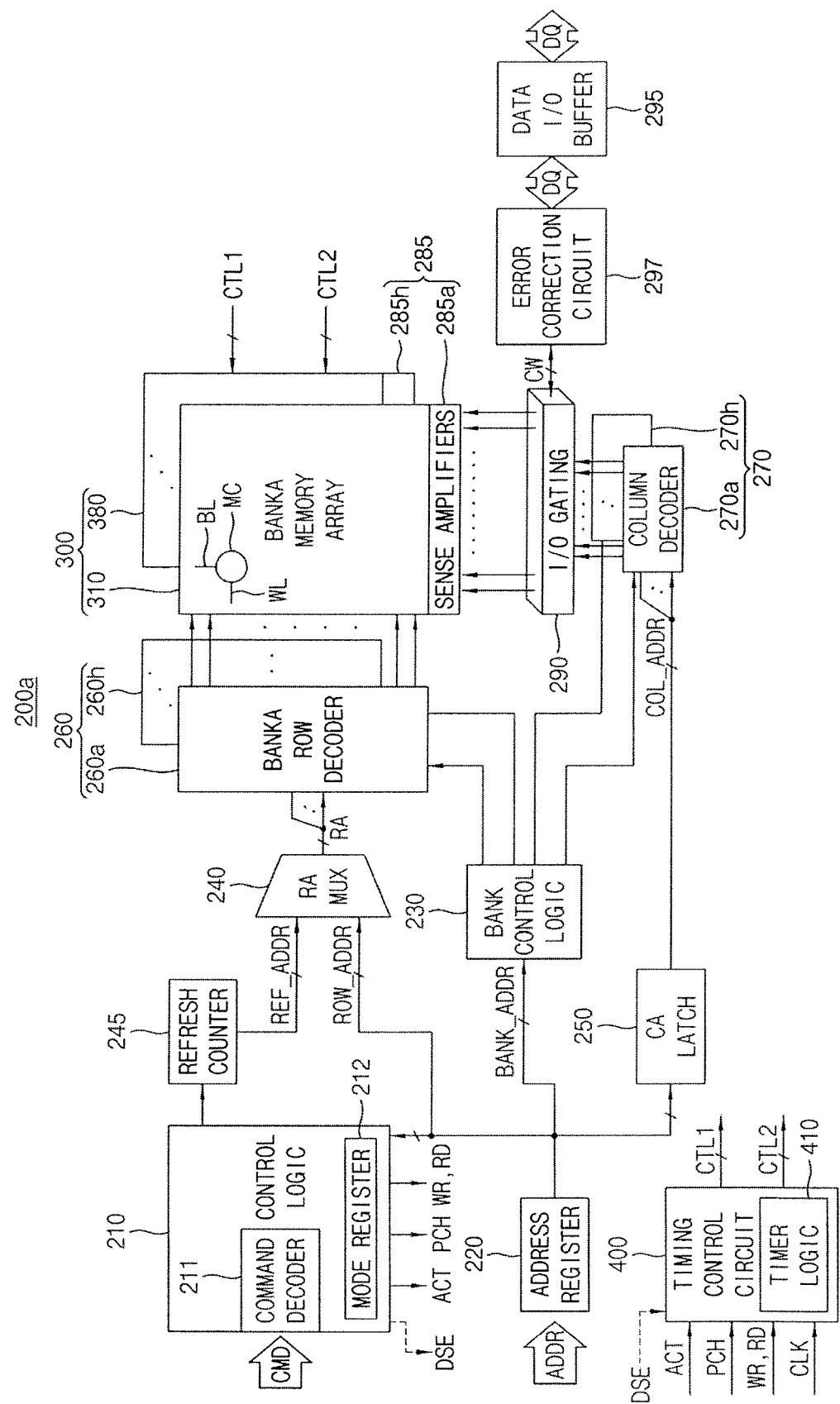
FIG. 3 is a block diagram illustrating an example of the semiconductor memory device in FIG. 2 according to exemplary embodiments of the inventive concept.

FIG. 3 is a block diagram illustrating an example of the semiconductor memory device in FIG. 2 according to exemplary embodiments of the inventive concept.

Referring to FIG. 3, the semiconductor memory device 200a may include, for example, a control logic 210, an address register 220, a bank control logic 230, a row address multiplexer 240, a column address latch 250, a row decoder 260, a column decoder 270, a memory cell array 300, a sense amplifier unit 285, an input/output (I/O) gating circuit 290, a data input/output (I/O) buffer 295, a refresh counter 245, an error correction circuit 297 and a timing control circuit 400.

The memory cell array 300 may include, for example, first through eighth bank arrays 310~380. The row decoder 260 may include first through eighth bank row decoders 260a~260h respectively coupled to the first through eighth bank arrays 310~380, the column decoder 270 may include first through eighth bank column decoders 270a~270h respectively coupled to the first through eighth bank arrays 310~380, and the sense amplifier unit 285 may include first through eighth bank sense amplifiers 285a~285h respectively coupled to the first through eighth bank arrays 310~380. The first through eighth bank arrays 310~380, the first through eighth bank row decoders 260a~260h, the first through eighth bank column decoders 270a~270h and first through eighth bank sense amplifiers 285a~285h may form first through eighth banks. Although the semiconductor memory device 200a is illustrated in FIG. 3 as including eight banks, a person of ordinary skill in the art should understand that the semiconductor memory device 200a may include any number of banks.

The address register 220 may receive an address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

With continued reference to FIG. 3, the bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through eighth bank row decoders 260a~260h.

The activated one bank row decoder of the first through eighth bank row decoders 260a~260h may decode the row address RA that is output from the row address multiplexer 240, and the bank row decoder may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In some embodiments, in a burst mode, the column address latch 250 may generate column addresses that increment from the received column address COL_ADDR. The column address latch 250 may apply the temporarily stored or generated column address to the first through eighth bank column decoders 270a~270h.

The activated one of the first through eighth bank column decoders 270a~270h may decode the column address COL_ADDR that is output from the column address latch 250, and may control the input/output gating circuit 290 to output data corresponding to the column address COL_ADDR.

The I/O gating circuit 290 may include a circuitry for gating input/output data. The I/O gating circuit 290 may further include read data latches for storing data that is output from the first through eighth bank arrays 310~380, and write drivers for writing data to the first through eighth bank arrays 310~380.

Data DQ to be read from one bank array of the first through eighth bank arrays 310~380 may be sensed by a sense amplifier coupled to the one bank array from which the data is to be read, and may be stored in the read data latches. The data DQ stored in the read data latches may be provided to the memory controller 100 via the data I/O buffer 295. Data DQ to be written in one bank array of the first through eighth bank arrays 310~380 may be provided to the data I/O buffer 295 from the memory controller 100. The write driver may write the data DQ in one bank array of the first through eighth bank arrays 310~380.

The control logic circuit 210 may control operations of the semiconductor memory device 200a. For example, the control logic circuit 210 may generate control signals for the semiconductor memory device 200a to perform a write operation or a read operation. The control logic circuit 210 may include a command decoder 211 that decodes a command CMD received from the memory controller 100 and a mode register 212 that sets an operation mode of the semiconductor memory device 200a. For example, the command decoder 211 may generate operation control signals ACT, PCH, WR, RD and DSE corresponding to the command CMD by decoding a write enable signal (/WE), a row address strobe signal (/RAS), a column address strobe signal (/CAS), a chip select signal (/CS), etc. The control logic circuit 210 may provide the operation control signals ACT, PCH, WR, RD and DSE to the timing control circuit 400. The operation control signals ACT, PCH, WR, RD and DSE may include an active signal ACT, a pre-charge signal PCH, a write signal WR, a read signal RD and/or a disable signal DSE.

The timing control circuit 400 may generate a first control signal CTL1 to control a voltage level of the word-line WL and a second control signal CTL2 to control a voltage level of the bit-line, in response to the operation control signals ACT, PCH, WR, RD and DSE and may provide the first and second control signals CTL1 and CTL2 to the memory cell array 300.

The timing control circuit 400 may enable a first word-line of the plurality of word-lines in response to a first command received from the memory controller 100, where the first word-line is selected in response to an access address, and may disable the first word-line with a negative voltage lower than a ground voltage at a second time point at which a comparison time interval starts at a first time point when the first command is applied to the semiconductor memory device and becomes substantially the same as a reference time interval at the second time point to reduce influence of disturbance. If the first word-line, which was enabled in response to the first command, remains at a voltage level associated with enablement, there can be leakage of charge to adjacent cells that is a form of disturbance. The leakage of charge may cause the memory cells to interact between themselves, and could result in an alteration of contents of adjacent memory cells.

According to an embodiment of the inventive concept, the timing control circuit 400 may enable the first word-line in response to the first command and then disable the first word-line with the negative voltage lower than the ground voltage in response to the disable signal DSE based on the disable command received from the memory controller 100 to reduce the influence of disturbance. The disabling of the first word-line may also be performed internally by the semiconductor memory device without receipt of a disable command from the memory controller.

FIGS. 4A to 4E are circuit diagrams of exemplary implementations of the memory cell shown in FIG. 3. An artisan should understand that the inventive concept is not limited to the circuit diagrams shown herein.

Figure 4A:
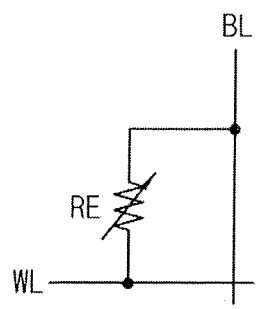
FIGS. 4A, 4B, 4C, 4D and 4E are circuit diagrams of exemplary implementations of the memory cell shown in FIG. 3.
Figure 4B:
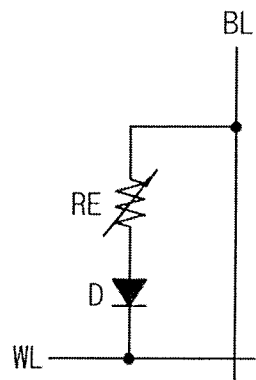
Figure 4C:
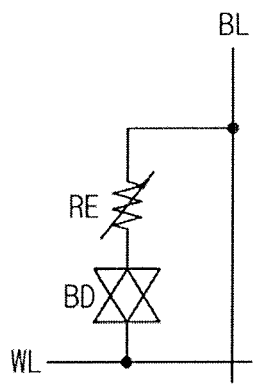
Figure 4D:
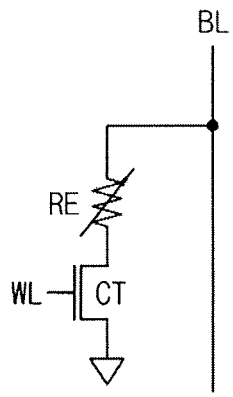
Figure 4E:
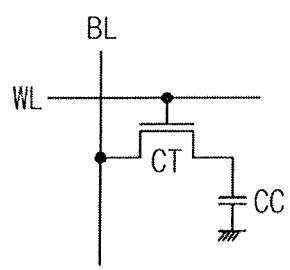

FIGS. 4A to 4D illustrate memory cells which are implemented with resistive type memory cells and FIG. 4E illustrates a memory cell which is implemented with a dynamic memory cell.

As shown in FIG. 4A, a memory cell may include a resistive element RE connected to a bit-line BL and a word-line WL. As shown in FIG. 4B, a memory cell may include a resistive element RE and a diode D. The structure of the resistive element RE may include a resistive material for data storage. The diode D may be a selection element (or switching element) that supplies current to resistive element RE or cuts off the current supply to resistive element RE according to a bias of word-line WL and bit-line BL. The diode D may be coupled between the resistive element RE and word-line WL, and the resistive element RE may be coupled between the bit-line BL and the diode D.

As shown in FIG. 4C, a memory cell may include a resistive element RE and a bidirectional diode BD. The resistive element R may include a resistive material for data storage. The bidirectional diode BD may be coupled between the resistive element RE and a word-line WL, and the resistive element RE may be coupled between a bit-line BL and bidirectional diode BD. As shown in FIG. 4D, a memory cell may include, for example, a resistive element RE and a transistor CT. The transistor CT may be a selection element (or switching element) that supplies current to the resistive element RE or cuts off the current supply to the resistive element RE according to a voltage of a word-line WL. The transistor CT may be coupled between the resistive element RE and a word-line WL, and the resistive element RE may be coupled between a bit-line BL and the transistor CT.

As shown in FIG. 4E, a memory cell may include a cell capacitor CC and a transistor CT. The transistor CT may be a selection element (or switching element) that connects/disconnects the cell capacitor CC to/from bit-line BL according to a voltage of a word-line WL. The transistor CT may be coupled between the cell capacitor CC, a word-line WL and a bit-line BL, and the cell capacitor CC may be coupled between the transistor CT and a plate voltage (not illustrated).

Figure 5:
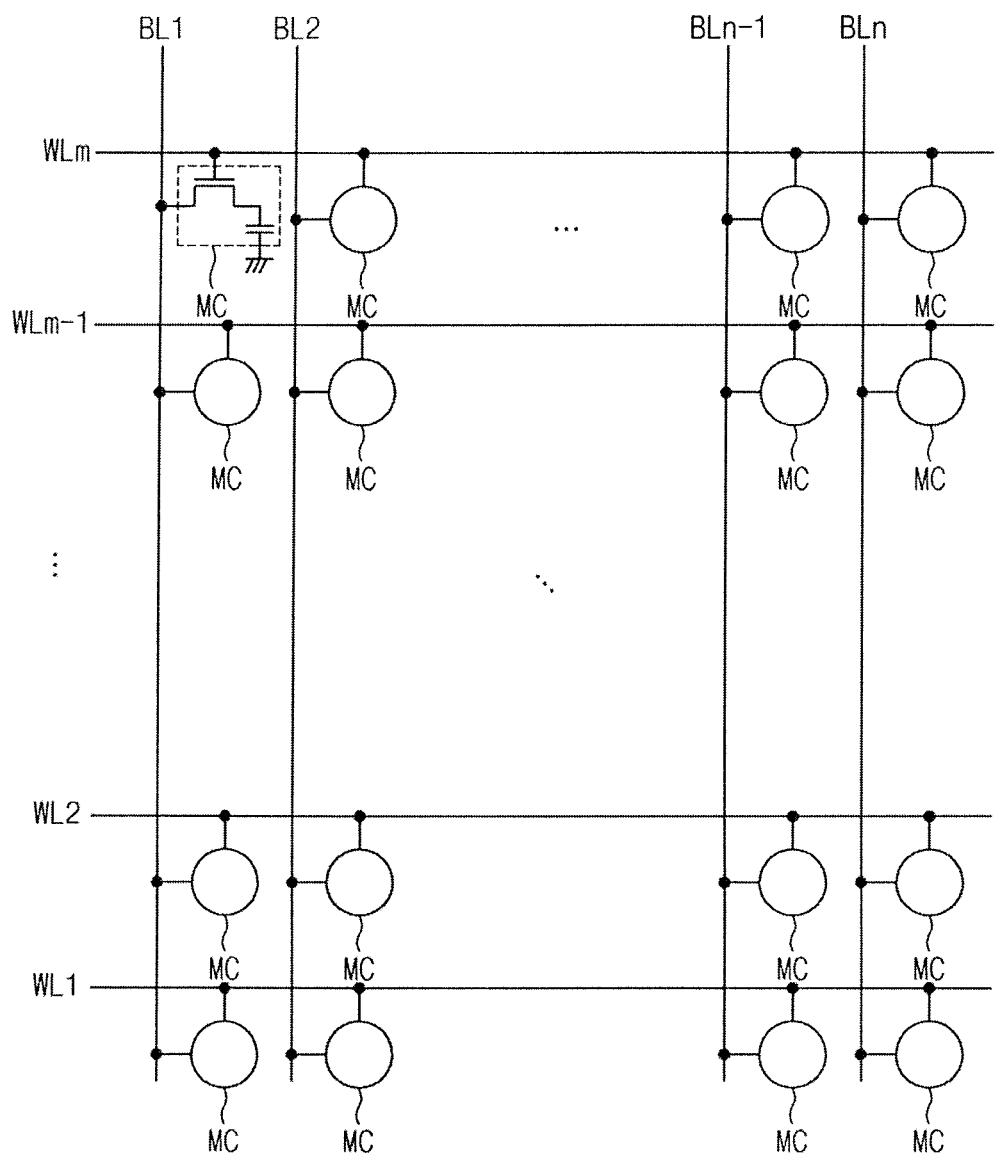
FIG. 5 illustrates an example of the first bank array in the semiconductor memory device of FIG. 3.

FIG. 5 illustrates an example of the first bank array in the semiconductor memory device of FIG. 3.

Figure 6:
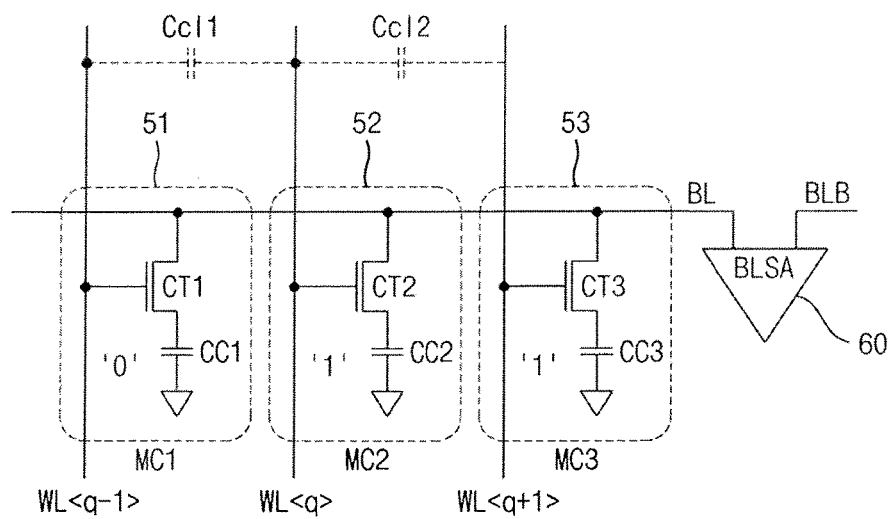
FIG. 6 is a circuit diagram illustrating an example of a disturbance between memory cells of a semiconductor memory device.

Referring to FIG. 6, the first bank array 310 includes a plurality of word-lines WL1~WLm (m is a natural number greater than two), a plurality of bit-lines BL1~BLn (n is a natural number greater than two), and a plurality of memory cells MCs disposed near intersections between the word-lines WL1~WLm and the bit-lines BL1~BTn.

FIG. 6 is a circuit diagram illustrating an example of a disturbance between memory cells of a semiconductor memory device.

In FIG. 6, it is assumed that each of the memory cells is implemented with the dynamic memory cell of FIG. 4E. A part of the semiconductor memory device includes memory cells 51, 52, and 53 and a bit-line sense amplifier 60.

It is assumed that each of the memory cells 51, 52, and 53 is connected to the same bit-line BL. In addition, the memory cell 51 is connected to a word-line WL<q−1>, the memory cell 52 is connected to a word-line WL<q>, and the memory cell 53 is connected to a word-line WL<q+1>. As shown in FIG. 6, the word-lines WL<q−1> and WL<q+1> are located adjacent to the word-line WL<q>. The memory cell 51 includes an access transistor CT1 and a cell capacitor CC1. A gate terminal of the access transistor CT1 is connected to the word-line WL<q−1> and its one terminal is connected to the bit-line BL. The memory cell 52 includes an access transistor CT2 and a cell capacitor CC2. A gate terminal of the access transistor CT2 is connected to the word-line WL<q> and its one terminal is connected to the bit-line BL. Also, the memory cell 53 includes an access transistor CT3 and a cell capacitor CC3. A gate terminal of the access transistor CT3 is connected to the word-line WL<q+1> and its one terminal is connected to the bit-line BL. The bit-line sense amplifier 60 may include an N sense amplifier discharging a low level bit line among bit lines BL and BLB and a P sense amplifier charging a high level bit line among the bit lines BL and BLB.

During a read operation or a write operation, a boosted voltage (for example, VPP) is provided to the word-line WL<q>. Then, due to capacitive coupling effect, a voltage of adjacent word-lines WL<q−1> and WL<q+1> rises even when no select voltage is applied. Such capacitive coupling is indicated with parasitic capacitances Ccl1 and Ccl2. As time interval increases during which the boosted voltage is applied to the word-line WL<q>, charges stored in the cell capacitors CC1 and CC3 of the memory cells 51 and 53 connected to the word-lines WL<q−1> and WL<q+1> may gradually leak. In this case, the reliability of a logic '0' stored in the cell capacitor CC1 and a logic '1' stored in the cell capacitor CC3 may not be guaranteed. Therefore, it may be desirable to disable the word-line WL<q> at an appropriate time.

According to exemplary embodiments of the inventive concept, the timing control circuit 400 may disable the word-line WL<q> to reduce the influence of the disturbance at an appropriate time point when a successive command is not applied during a reference time interval after the active command is applied for the word-line WL<q>, or when the disable command is applied from the memory controller 100 after the reference time interval.

Figure 7:
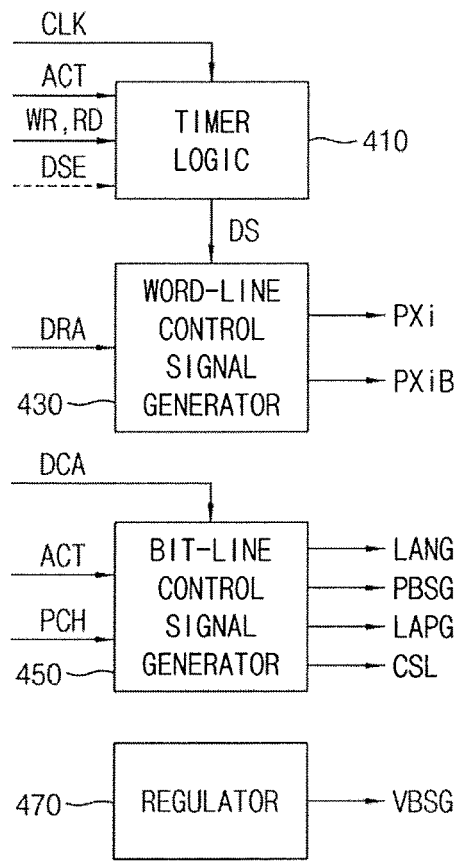
FIG. 7 is a block diagram illustrating an example of the timing control circuit in the semiconductor memory device of FIG. 3 according to exemplary embodiments of the inventive concept.

FIG. 7 is a block diagram illustrating an example of the timing control circuit in the semiconductor memory device of FIG. 3 according to exemplary embodiments of the inventive concept.

Referring to FIG. 7, the timing control circuit 400 may include a timer logic 410, a word-line control signal generator 430, a bit-line control signal generator 450 and a regulator 470.

The timer logic 410 may receive, for example, the operation control signals ACT, PCH, WR, RD and DSE corresponding to the commands CMD. The timer logic 410 compares the comparison time interval with the reference time interval from a first time point, which starts at a time point at which the timer logic 410 receives the active signal ACT corresponding to the first command (for example, the active command), and activates a pulsed-type decision signal DS when a second command is not received during the reference time interval. The timer logic 410 counts a toggling number of the clock signal CLK (i.e. a toggle count) from the first time point and activates the decision signal DS at a second time point at which the counted toggling number becomes the same as a toggling number during the reference time interval. In other exemplary embodiments, the timer logic 410 may activate the decision signal DS when the timer logic 410 receives the disable signal DSE based on the disable command.

The word-line control signal generator 430 may generate a first control signal CTL1 (FIG. 3) including first and second word-line control signals PXi and PXiB (FIG. 7) to control a word-line based on a decoded row address DRA. The word-line control signal generator 430 may transit the second word-line control signal PXiB which provides a negative voltage to a selected word-line to disable the selected word-line, in response to a transition of the decision signal DS. The bit-line control signal generator 450 may provide a bit-line sense amplifier 650 (in FIG. 10) with second control signals LANG, PSBG, LAPG, and CSL to control voltage levels of a bit-line pair of a selected memory cell, in response to the operation control signals ACT and PCH and a decoded column address DCA. The regulator 470 may generate a boosted sense voltage VBSG.

Figure 8:
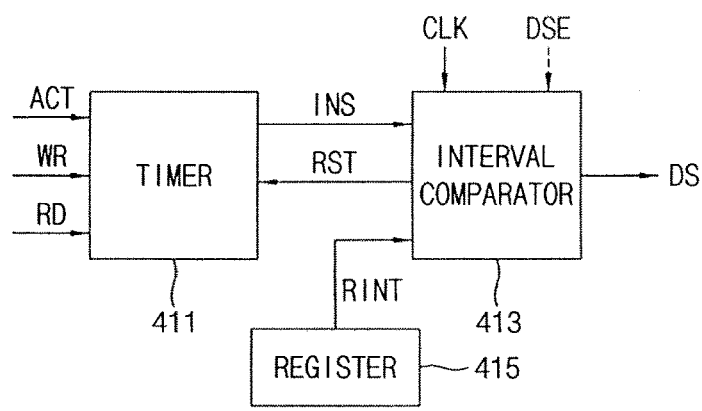
FIG. 8 is a block diagram illustrating the timer logic in the timing control circuit of FIG. 7 according to exemplary embodiments of the inventive concept.

FIG. 8 is a block diagram illustrating the timer logic in the timing control circuit of FIG. 7 according to exemplary embodiments of the inventive concept.

Referring to FIG. 8, the timer logic 410 may include a timer 411, a time interval comparator 413 and a register 415. The register 415 may store a time interval corresponding to a reference time interval RINT or the toggling number of the clock signal CLK during the reference time interval RINT.

The timer 411 receives the operation control signals ACT, WR, and RD from the control logic circuit 210 (FIG. 3), generates an interval signal INS having different pulse widths when the operation control signals ACT, WR, and RD are received, and provides the interval signal INS to the time interval comparator 413. The time interval comparator 413 may start a counting operation of counting the clock signal CLK at a time point at which the interval signal INS corresponding to the active signal ACT is applied, and activates the pulsed-type decision signal DS at a time point at which the toggling number of the clock signal CLK becomes the toggling number of the clock signal CLK in the reference time interval RINT. The interval comparator 413 may provide the decision signal DS to the word-line control signal generator 430 in FIG. 7. The interval comparator 413 may reset the timer 411 by applying a reset signal RST to the timer 411 when the interval signal INS corresponding to the write signal WR or the read signal RD is applied within the reference time interval RINT after the interval signal INS corresponding to the active signal ACT is applied to the interval comparator 413. In other exemplary embodiments, the interval comparator 413 may activate the decision signal DS when the interval comparator 413 receives the disable signal DSE.

Figure 9:
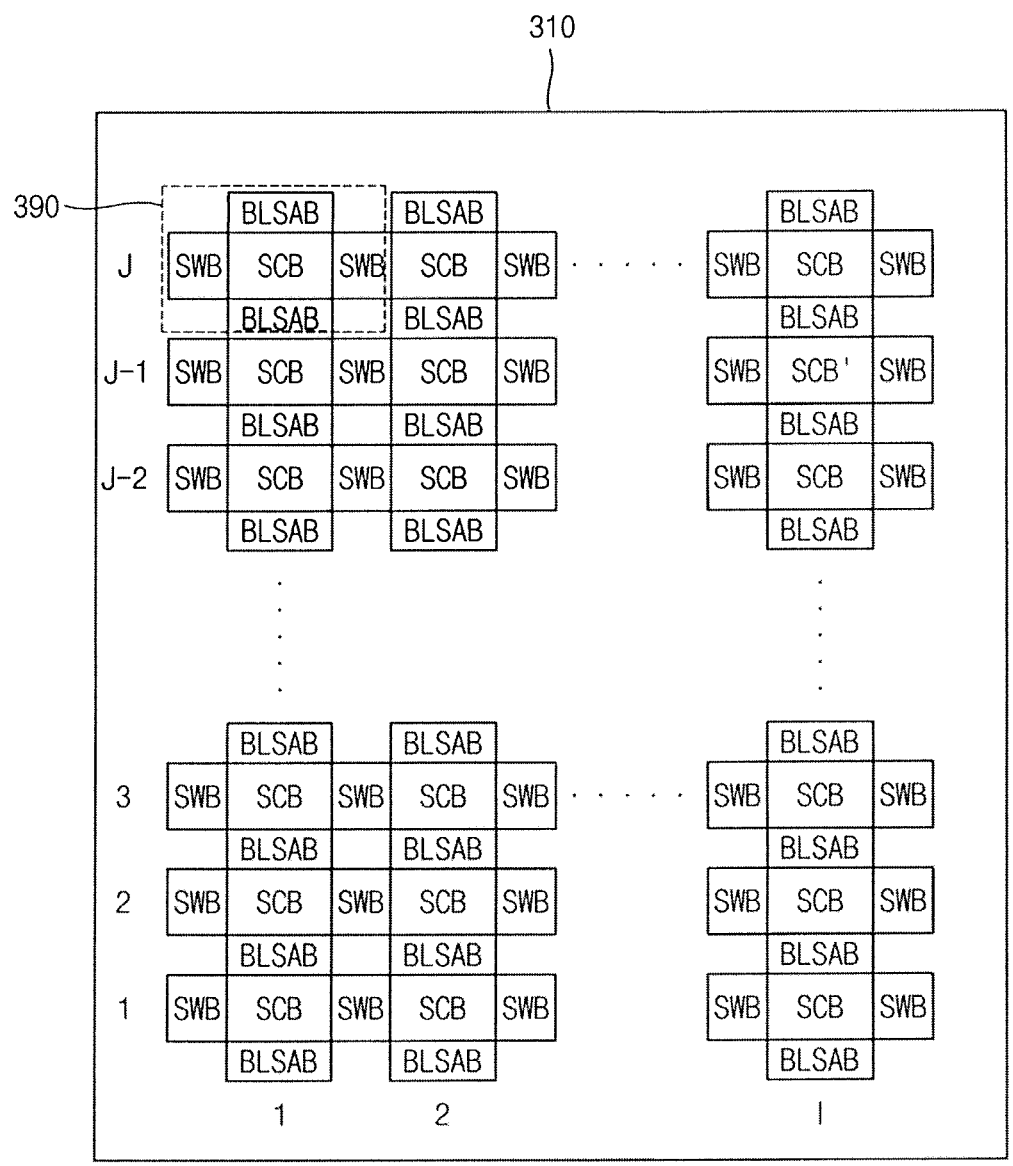
FIG. 9 is a diagram illustrating an example architecture of one bank array in the semiconductor memory device of FIG. 3.

FIG. 9 illustrates an example of an architecture of one bank array in the semiconductor memory device of FIG. 3.

Referring to FIG. 9, in the first bank array 310, I sub-array blocks SCB may be disposed in a first direction D1, and J sub-array blocks SCB may be disposed in a second direction D2 orthogonal to the first direction D1. A plurality of bit-lines, a plurality of word-lines, and a plurality of memory cells may be disposed in each of the sub array blocks SCB. The plurality of memory cells may be disposed at intersections between the bit-lines and the word-lines. I+1 sub word-line driver regions SWB may be disposed between the sub array blocks SCB in the first direction D1. Sub word-line drivers may be disposed in the sub word-line driver regions SWB. J+1 bit-line sense amplifier regions BLSAB may be disposed between the sub array blocks SCB in the second direction D2. Bit-line sense amplifiers to sense data stored in the memory cells may be disposed in the bit-line sense amplifier regions BLSAB.

Figure 10:
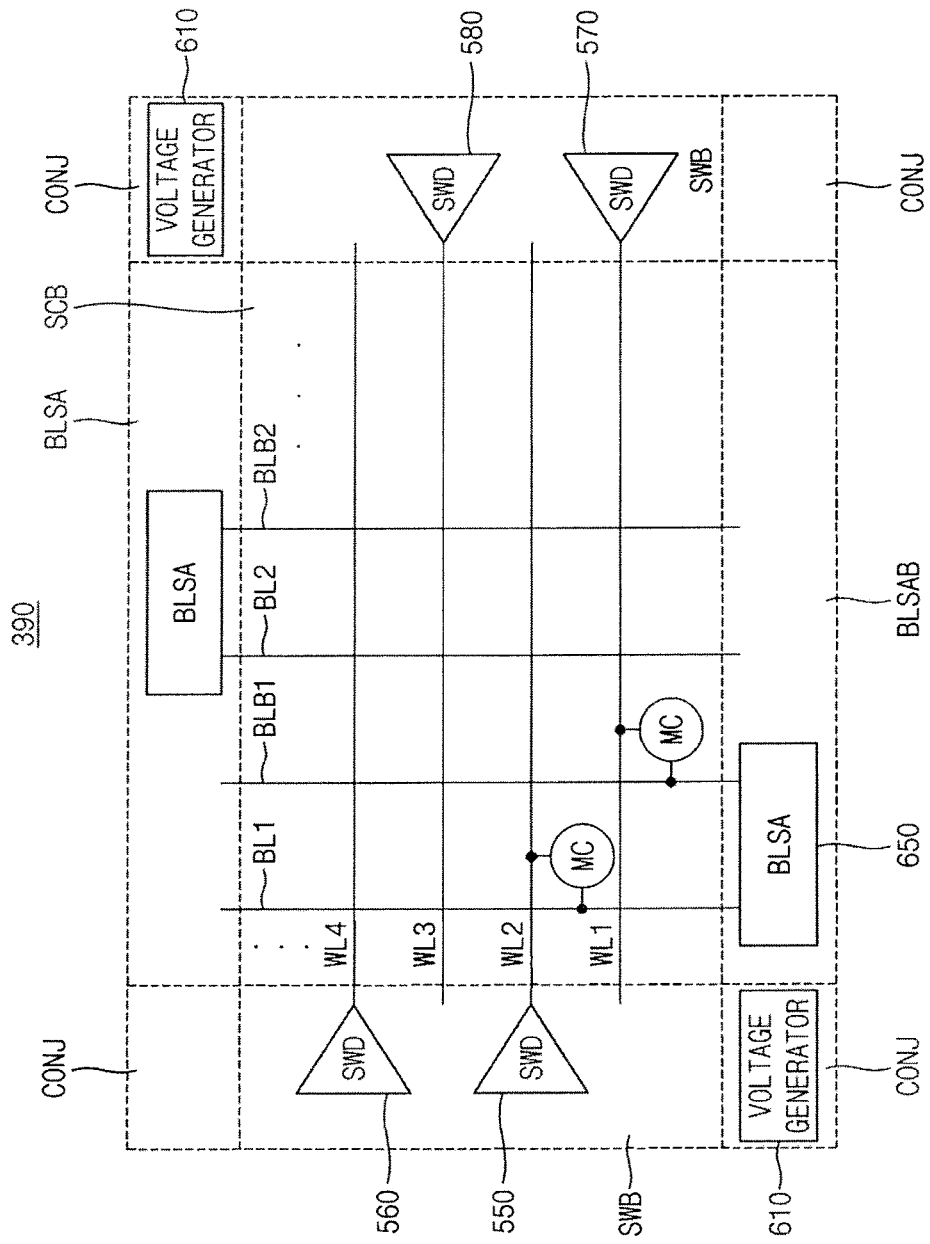
FIG. 10 is an example of a sub-array in FIG. 9 according to exemplary embodiments of the inventive concept.

FIG. 10 is an example of a sub-array in FIG. 9 according to exemplary embodiments of the inventive concept.

Referring to FIGS. 9 and 10, in a portion 390 of the first bank array 310, the sub-array block SCB, the bit-line sense amplifier regions BLSAB, the sub word-line driver regions SWB and conjunction regions CONJ are disposed.

The sub-array block SCB includes a plurality of word-lines WL1~WL4 extending in a row direction and a plurality of bit-line pairs BL1~BL2 and BLB1~BLB2 extending in a column direction. The sub-array block SCB includes a plurality of memory cells MCs disposed at intersections between the word-lines WL1~WL4 and the bit-line pairs BL1~BL2 and BLB1~BLB2.

The sub word-line driver regions SWB include a plurality of sub word-line drivers 550, 560, 570 and 580 that drive the word-lines WL1~WL4 respectively. The sub word-line drivers 550 and 560 may be disposed in the sub word-line driver region SWB which is left with respect to the sub-array block SCB and the sub word-line drivers 550 and 560 may be disposed in the sub word-line driver region SWB which is right with respect to the sub array block SCB.

The bit-line sense amplifier regions BLSAB include bit-line sense amplifiers BLSA coupled to the bit-line pairs BL1~BL2 and BLB1~BLB2. The bit-line sense amplifier may sense and amplify a voltage difference between the bit-line pair BL and BLB to provide the amplified voltage difference to a local input/output line pair. As illustrated in FIG. 10, the bit-line sense amplifiers BLSA may be alternately disposed at upper portion and a lower portion of the sub array block SCB. The conjunction regions CONJ are disposed adjacent to the bit-line sense amplifier regions BLSAB, the sub word-line driver regions SWB and the sub-array bloc SCB. A plurality of voltage generators 610 may be disposed in the conjunction regions CONJ. The voltage generators 610 may provide the sub word-line drivers 550, 560, 570 and 580 with a boosted voltage and the negative voltage.

Figure 11:
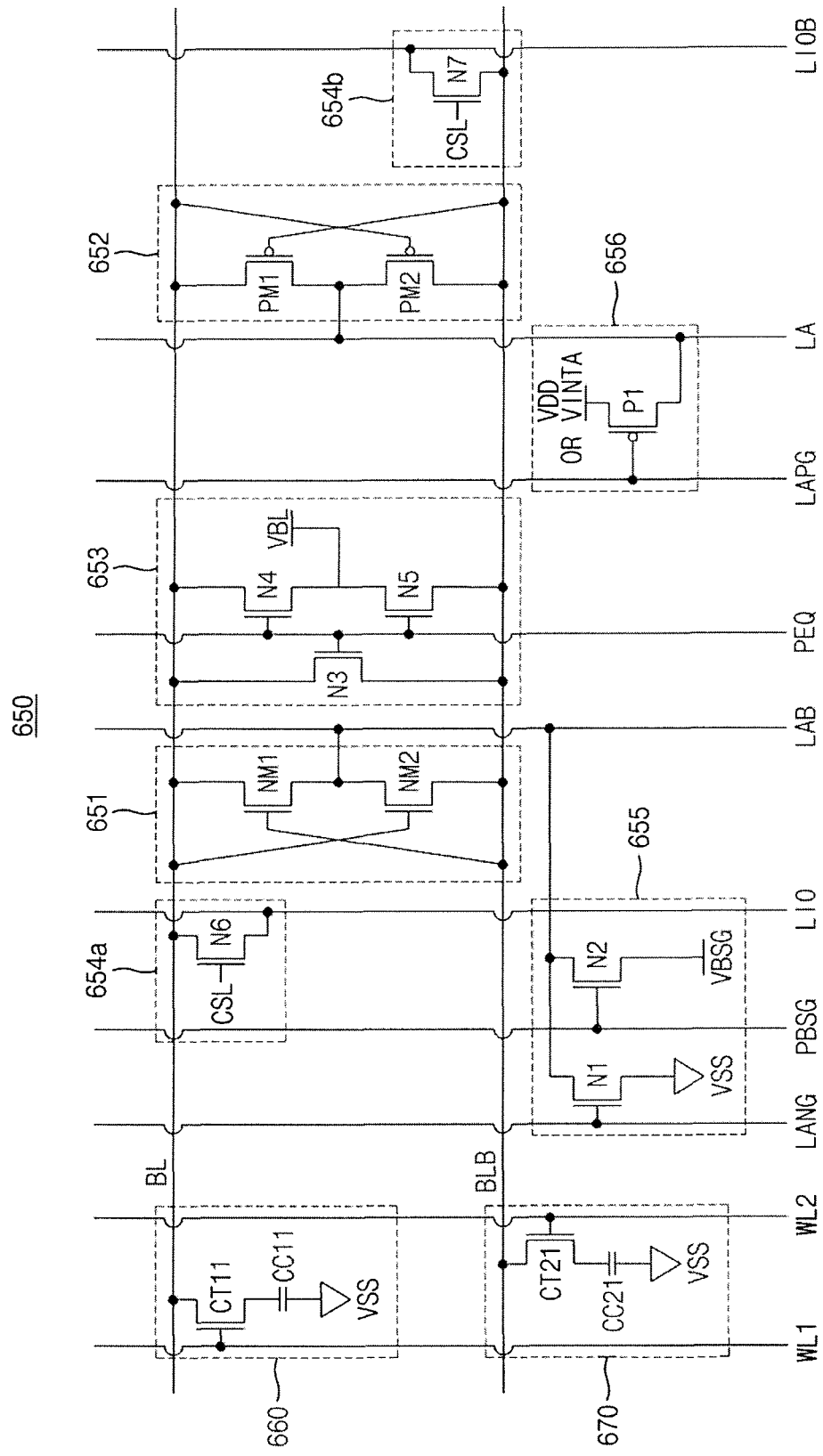
FIG. 11 is a circuit diagram illustrating a bit-line sense amplifier in FIG. 10 according to exemplary embodiments of the inventive concept.

FIG. 11 is a circuit diagram illustrating a bit-line sense amplifier in FIG. 10 according to exemplary embodiments of the inventive concept.

Referring to FIG. 11, a bit-line sense amplifier 650 is coupled to bit-lines BL and BLB of each of memory cells 660 and 670 in the memory cell array 300.

The bit-line sense amplifier 650 may include, for example, an N-type sense amplifier 651, a P-type sense amplifier 652, a pre-charge circuit 653, column select switches 654a and 654b, an NSA driver 655, and a PSA driver 656.

The N-type sense amplifier 651 provides a discharge of a low-level bit-line of the bit-lines (or, bit-line pair) BL and BLB to a low-level during a sensing operation. The N-type sense amplifier 651 includes two n-channel metal oxide semiconductor (NMOS) transistors NM1 and NM2. A gate of the NMOS transistor NM1 is connected to the bit-line (second bit-line) BLB, and a drain of the NMOS transistor NM1 is connected to the bit-line (first bit-line) BL, and a source of the NMOS transistor NM1 is connected to a sense enable line LAB. The NMOS transistor NM2 has a gate connected to the bit-line BL, a drain connected to the bit-line BLB, and a source connected to the sense enable line LAB. The N-type sense amplifier 651 connects a low-level bit-line to the sense enable line LAB. The sense enable line LAB is connected to the ground voltage VSS or the boosted sense ground voltage VBSG. The low-level bit line is one of the bit lines BL and BLB according to data stored in a selected memory cell 660 or 670.

With continued reference to FIG. 11, an operation is described under assumption that data stored in a memory cell 660 storing logic state "1" is sensed. First, the bit-lines BL and BLB are pre-charged and equalized to the pre-charge voltage VDD/2 by a pre-charge circuit 653. A cell transistor CT11 is turned on when a word-line WL1 is activated to select the memory cell 660. At this time, charges stored in a cell capacitor CC11 are shared with the bit-line BL. A voltage of the bit-line BL is higher than the pre-charge voltage VDD/2 by the charge sharing, and the bit-line BLB maintains the half voltage VDD/2. The NSA driver 655 provides a boosted sense ground voltage VBSG to the bit-line BLB through the sense enable line LAB and the NMOS transistor NM2 whose gate is connected to the bit-line BL with a voltage increased by the charge sharing. On the other hand, the transistor NM1 gradually closes a current path between the sense enable line LAB and the bit-line BL as the voltage level of the bit-line BLB goes to the low level. The gate of the transistor NM1 is connected to the bit-line BLB, and is coupled to the boosted sense ground voltage VBSG.

The N-type sense amplifier 651 may be provided with a stable boosted sense ground voltage VBSG.

The P-type sense amplifier 652 charges a high-voltage bit-line of the bit-lines BL and BLB with a power supply voltage VDD level or an internal voltage VINT level at a sensing operation. The P-type sense amplifier 652 includes two p-channel metal oxide semiconductor (PMOS) transistors PM1 and PM2. The PMOS transistor PM1 has a gate connected to the bit-line BLB, a source connected to the bit-line BL, and a drain connected to a sense enable line LA. The PMOS transistor PM2 has a gate connected to the bit-line BL, a source connected to the bit-line BLB, and a drain connected to the sense enable line LA. The P-type sense amplifier 652 charges a high-voltage bit-line of the bit-lines BL and BLB with a power supply voltage VDD provided to the sense enable line LA. When data stored in the memory cell 660 storing logic state "1" is sensed, the bit-lines BL and BLB are pre-charged and equalized to the pre-charge voltage VDD/2 by the pre-charge circuit 653. The cell transistor CT11 is turned on when the word-line WL1 is activated to select the memory cell 660. At this time, charges stored in a cell capacitor CC11 are shared with the bit-line BL. A voltage of the bit-line BL is higher than the pre-charge voltage VDD/2 by the charge sharing, and the bit-line BLB maintains the half voltage VDD/2.

The PSA driver 656 provides a charging voltage (VDD or VINTA) to the sense enable line LA. Therefore, the transistor PM2 is turned off because the gate of the transistor PM2 is coupled to the bit-line with a voltage increased by the charge sharing. On the other hand, the transistor PM1 is turned on because the gate of the transistor PM1 is coupled to the bit-line that is provided with the boosted sense ground voltage VBSG. The voltage of the bit-line BL goes to the power supply voltage VDD level which is provided to the sense enable line LA.

The pre-charge circuit 653 pre-charges the bit-lines BL and BLB with a half voltage VDD/2 in response to a control signal PEQ in sensing operation. When the control signal PEQ is activated, the pre-charge circuit 653 supplies a bit-line pre-charge voltage VBL to the bit-lines BL and BLB. The bit-line pre-charge voltage VBL may be a half voltage VDD/2. The bit-lines BL and BLB are connected such that their voltages are equalized. If the bit-lines BL and BLB are charged by the pre-charge level VBL, the control signal PEQ is inactivated. The pre-charge circuit 653 includes NMOS transistors N3, N4 and N5. The column select switches 654a and 654b connect data sensed by the N-type sense amplifier 651 and the P-type sense amplifier 652 to input/output lines LIO and LIOB in response to a column select signal CSL. The column select switches 654a and 654b are turned on such that the sensed data is transferred to the input/output lines LIO and LIOB. For example, in a read operation when sensing levels of the N-type sense amplifier 651 and the P-type sense amplifier 652 are stabilized, a column selection signal CSL is activated. Then the column select switches 654a and 654b are turned on such that the sensed data is transferred to the input/output lines LIO and LIOB. Voltages of the bit-lines BL and BLB are varied when charges of bit-lines BL and BLB are shared with the input/output lines LIO and LIOB. The column select switches 654a and 654b includes NMOS transistors N6 and N7.

The NSA driver 655 provides a driving signal to the sense enable line LAB of the N-type sense amplifier 651. The NSA driver 655 receives control signals LANG and PBSG from the bit-line control signal generator 450. Based on the control signals LANG and PBSG, the NSA driver 655 grounds the sense enable line LAB or supplies the boosted sense ground voltage VBSG to the sense enable line LAB. The NSA driver 655 includes the ground transistor N1 and a boosting transistor N2 to control a voltage of the sense enable line LAB.

The PSA driver 656 provides the charge voltage VDD to the sense enable line LA of the P-type sense amplifier 652. The PSA driver 656 is controlled by the control signal LAPG from the bit-line control signal generator 450. The control signals LAPG and LANG are complementary to each other.

Figure 12:
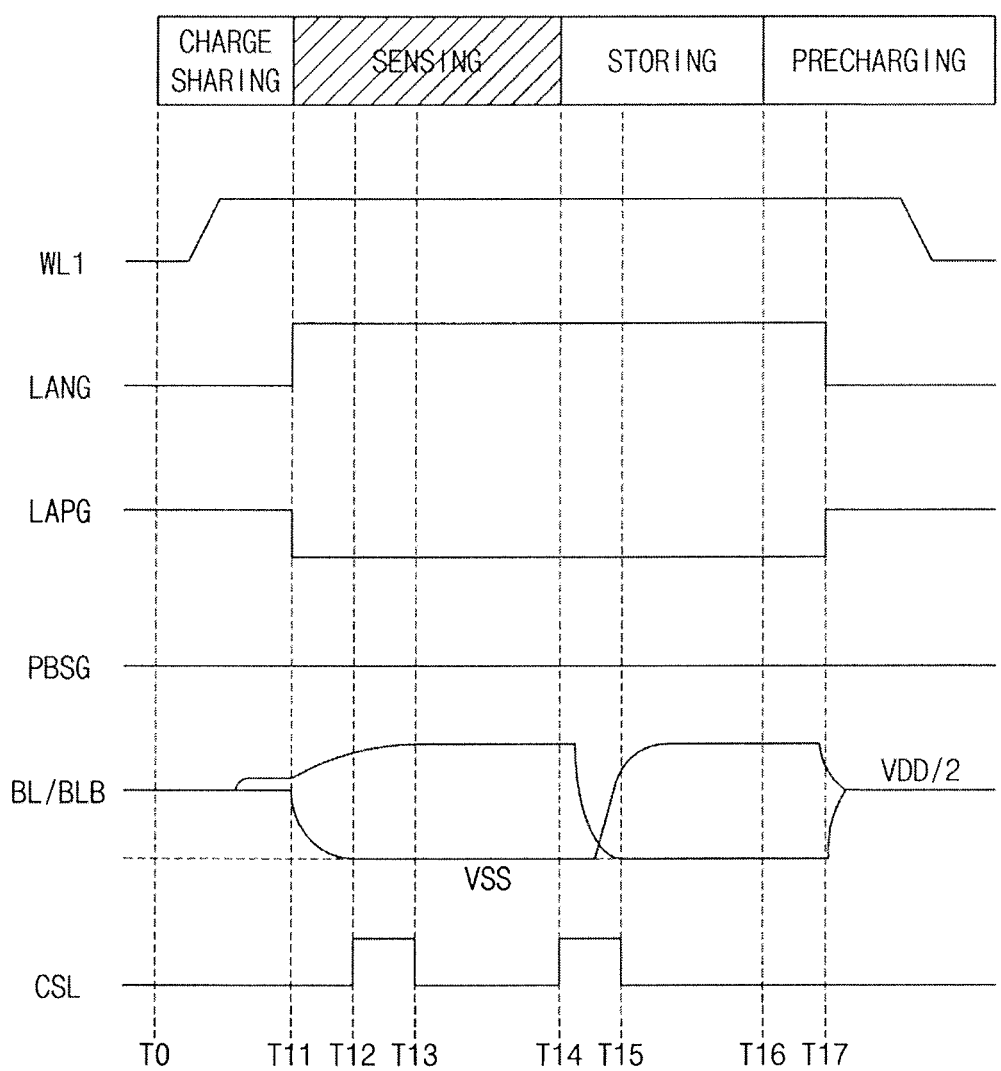
FIG. 12 is a timing diagram illustrating an operation of the bit-line sense amplifier in FIG. 11.

FIG. 12 is a timing diagram illustrating an example of an operation of the bit-line sense amplifier in FIG. 11.

Referring to FIGS. 11 and 12, at T0, a word-line WL1 is activated to access a selected memory cell (for example, the memory cell 660 in FIG. 11). A voltage of the bit-line BL increases by the charge sharing and a voltage of the bit-line is maintained at the pre-charge voltage VDD/2 during an time interval between T0 and T11. The control signal LANG is maintained at a high level and the control signal PBSG is maintained at a low level during a time interval between T11 and T17. Therefore, a voltage of the bit-line BL is maintained at a charge voltage VDD and the voltage of the bit-line BLB is maintained at the ground voltage VSS.

Figure 13:
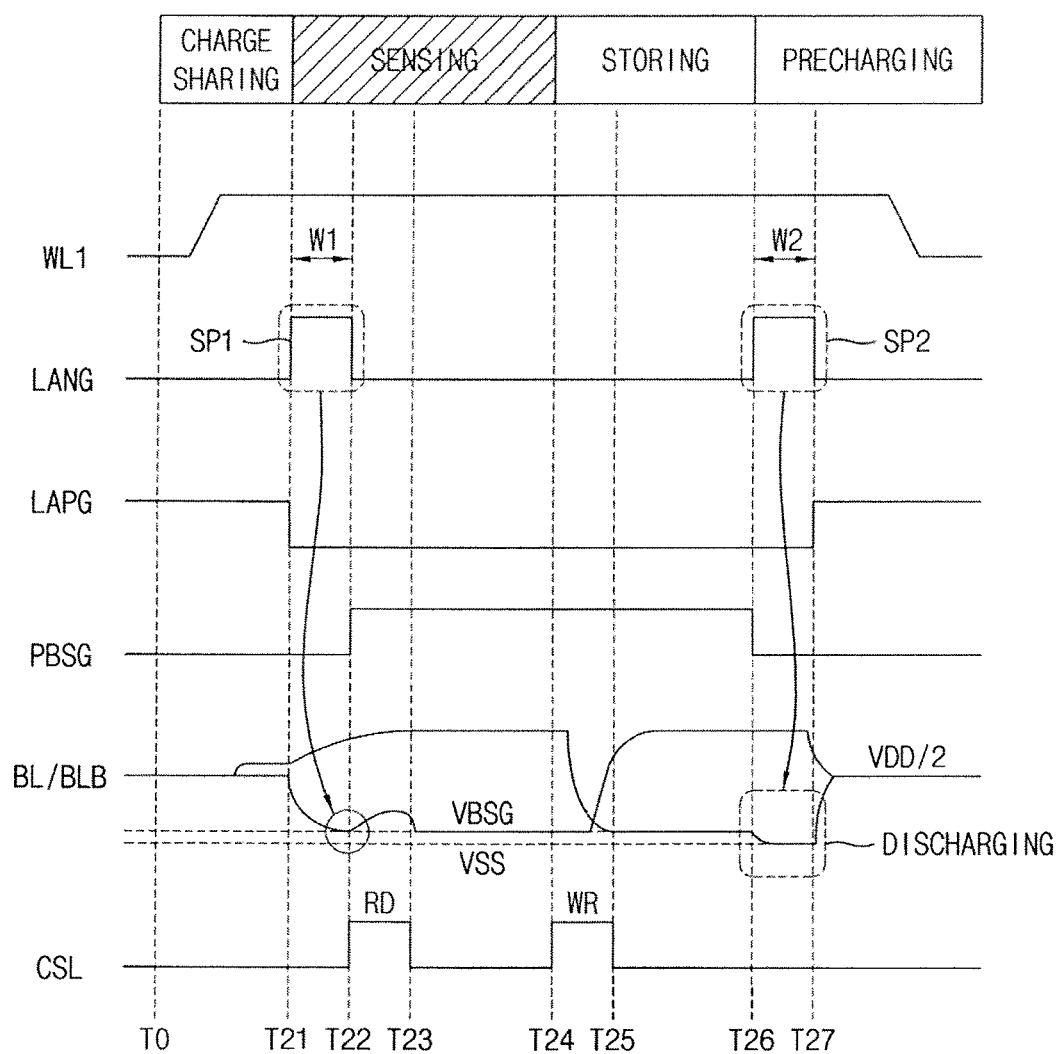
FIG. 13 is a timing diagram illustrating an operation of the bit-line sense amplifier in FIG. 11.

With reference to FIG. 12, the column selection signal CSL is activated for data output between T12 and T13. Between T14 and T15, a write command is applied to the same bank activated by the active signal ACT of the read command. According to the write command, a column selection signal CSL is activated and input data is transferred to bit-lines BL and BLB from data input/output lines LIO and LIOB. At this time, the high-level bit-line is discharged toward a low level, and the low-level bit-line is charged toward a high level. Input data is stored in a selected memory cell by the N-type sense amplifier 651 and the P-type sense amplifier 652. At T16, the pre-charge signal PCH is activated according to a pre-charge command. A pre-charge operation on bit-lines is performed. The selected bit-lines developed to different voltage levels are pre-charged to a pre-charge voltage VDD/2 at T17. FIG. 13 is a timing diagram illustrating an example of an operation of the bit-line sense amplifier in FIG. 11.

Operation of a timing diagram of FIG. 13 between T21 and T27 is substantially similar to the operation of the timing diagram of FIG. 12 between T11 and T17. Therefore, the discussion of FIG. 13 will be directed toward a difference between FIG. 12 and FIG. 13.

In FIG. 13, it is possible to provide in a stable manner the boosted sense ground voltage VBSG to a low-level bit-line when charges are shared between a bit-line and a data input/output in response to a column selecting signal CSL. If the active signal ACT or the pre-charge signal PCH is received, selected bit-lines are pre-charged with a pre-charge voltage VDD/2.

At T21, the bit-line control signal generator 450 (FIG. 7) provides the control signal LANG having a first pulse SP1. Here, the first pulse SP1 has a pulse width W1. The control signal LAPG is activated to a low level. For example, the bit-line control signal generator 450 may generate the control signal LANG having a first pulse SP1, whose width corresponds to a discharge time for which the low level bit-line is discharged toward the boosted sense ground voltage VBSG. At T22, the first pulse SP1 ends. A control signal PBSG is activated at the same time when the first pulse SP1 ends. The boosted sense ground voltage VBSG is supplied to the low-level bit-line BL through the N-type sense amplifier 651 while the control signal PBSG is activated. At this time, the boosted sense ground voltage VBSG generated by the voltage regulator 470 is provided to the N-type sense amplifier 651. The low-level bit-line BL is stably set to the boosted sense ground voltage VBSG.

The column selection signal CSL is activated for data output (a read) between T22 and T23, regardless of when the first pulse SP1 ends. The column selection signal CSL is activated at any time if a voltage difference of the bit-lines BL and BLB is enough to detect output data. At this time, pre-charged input/output lines LIO and LIOB (FIG. 11) are connected to the bit-lines BL and BLB, and a charge sharing occurs between the pre-charged input/output lines LIO and LIOB, and the bit-lines BL and BLB. For example, charges of the pre-charged input/output line LIO flow into the bit-line BL that is set to the boosted sense ground voltage VBSG. In this case, the bit-line BL may be subject to overshoot or undershoot due to the charge sharing of the pre-charged input/output lines LIO and LIOB and the bit lines BL and BLB. Since the low-level bit-line BL is coupled to the voltage regulator 470 for generating the boosted sense ground voltage VBSG, the disturbance of the low-level bit-line BL is quickly removed and thus the low-level bit-line voltage is quickly recovered to the boosted sense ground voltage VBSG level.

At T24, the column selection signal CSL is activated for a data input (a write) between T24 and T25. According to a write command, a column selection signal CSL is activated and input data is transferred to bit-lines BL and BLB from data input/output lines LIO and LIOB. At this time, the high-level bit-line is discharged toward a low level, and the low-level bit-line is charged toward a high level. Input data may be stored in a selected memory cell by the N-type sense amplifier 651 and the P-type sense amplifier 652.

At T26, the bit-line control signal generator 450 provides the control signal LANG having a second pulse SP2 in response to the pre-charge signal PCH. The low-level bit line is discharged to a ground level during an interval corresponding to a pulse width W2 of the second pulse SP2. At T27, selected bit-lines are pre-charged to the pre-charge voltage VDD/2. Since the low-level bit line BL is discharged to the ground voltage VSS, voltages of the bit-lines converges to the pre-charge voltage VDD/2.

Figure 14:
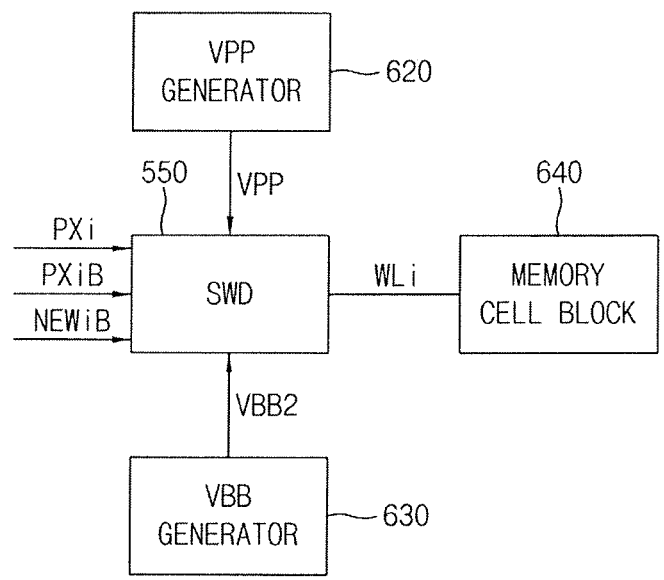
FIG. 14 illustrates a portion of the first bank array of FIG. 10.

FIG. 14 illustrates the portion 390 of the first bank array 310 of FIG. 10, in which the boosted voltage generator 620 generates a boosted voltage VPP provided to the sub word-line driver (SWD) 550. In addition, a negative voltage generator 630 generates a negative voltage VBB2 provided to the sub word-line driver 550. The boosted voltage generator 620 and the negative voltage generator 630 may be included in the voltage generator 610 shown in FIG. 10. The sub word-line driver 550 may enable a word-line WLi with the boosted voltage VPP, or may disable the word-line WLi with the negative voltage VBB2 in response to first and second word-line control signals PXi and PXiB and a word-line enable signal NEWiB. The word-line WLi may be coupled to a memory cell block 640.

Figure 15:
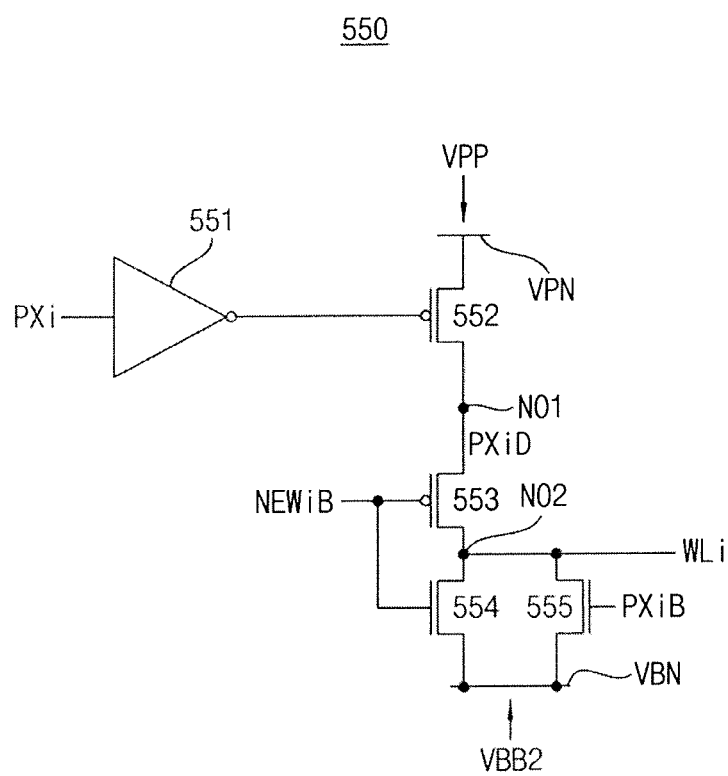
FIG. 15 is a circuit diagram illustrating an example of the sub word-line driver in FIG. 14 according to exemplary embodiments of the inventive concept.

FIG. 15 is a circuit diagram illustrating an example of the sub word-line driver in FIG. 14 according to exemplary embodiments of the inventive concept.

Referring to FIG. 15, the sub word-line driver 550 may include an inverter 551, PMOS transistors 552 and 553, and NMOS transistors 554 and 555. The inverter 551 inverts the first word-line control signal PXi and is coupled to a gate of the PMOS transistor 552. The PMOS transistor 552 has a source connected to a boosted voltage terminal VPN, a gate receiving an output of the inverter 551 and a drain connected to a boosted node NO1. As also shown in FIG. 15, the PMOS transistor 553 has a source connected to the boosted node NO1, a gate receiving word-line enable signal NEWiB and a drain connected to an enable node NO2.

With regard to the NMOS transistors 554 and 555, the NMOS transistor 554 has a drain connected to the enable node NO2, a gate receiving the word-line enable signal NEWiB and a source connected to a negative voltage terminal VBN. The NMOS transistor 555 has a drain connected to the enable node NO2, a gate receiving the second word-line enable control signal PXiB and a source connected to the negative voltage terminal VBN. The boosted voltage VPP is applied to the boosted voltage terminal VPN and the negative voltage VBB2 is applied to the negative voltage terminal VBN.

The PMOS transistor 552 receives the boosted voltage VPP, and transfers the boosted voltage to the boost node NO1 in response to the first word-line enable control signal PXi. The PMOS transistor 553 receives the boosted voltage from the PMOS transistor 552 through a source and enables a corresponding word line WLi connected to the enable node NO2 with the boosted voltage in response to the word-line enable signal NEWiB. With regard to the NMOS transistors, FIG. 15 shows that the NMOS transistor 554 transfers the negative voltage VBB2 to the enable node NO2 in response to the word-line enable signal NWEiB and the NMOS transistor 555, and the NMOS transistor 555 disables the corresponding word-line WLi connected to the enable node NO2 with the negative voltage in response to the second word-line enable control signal PXiB.

Figure 16:
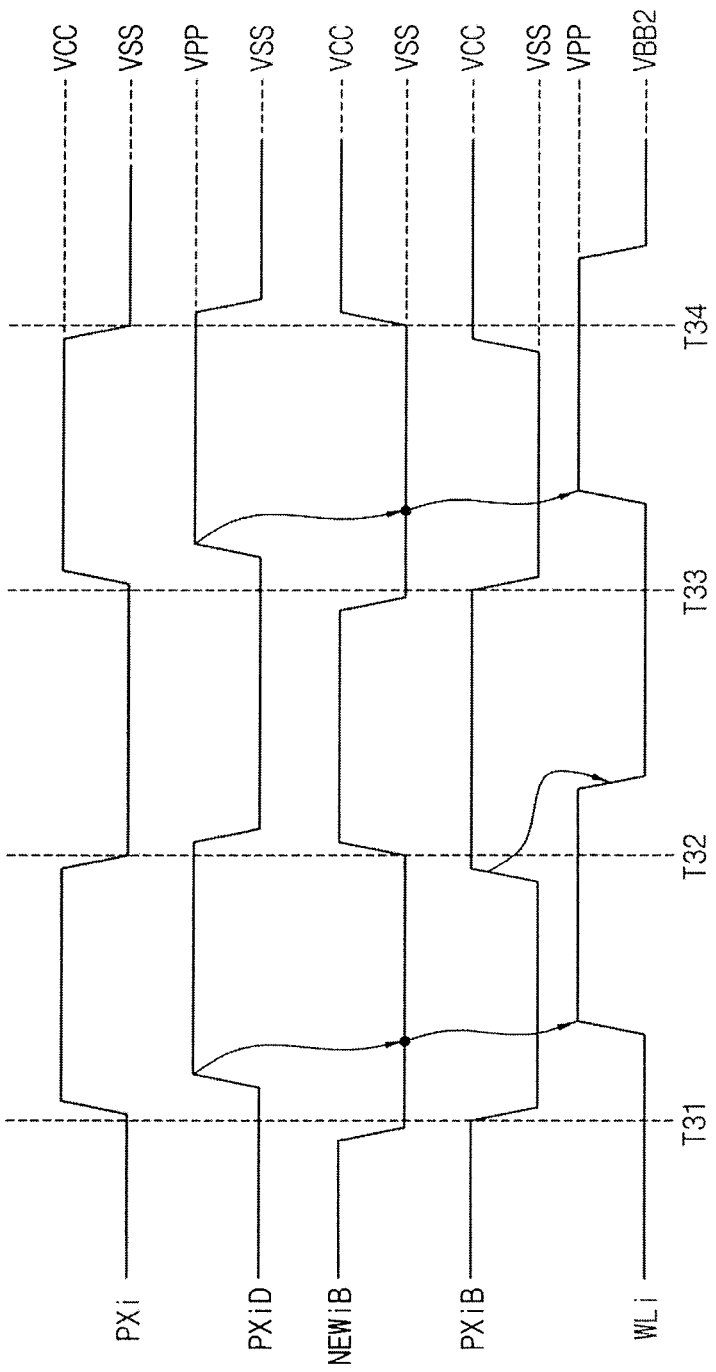
FIG. 16 is a timing diagram illustrating an operation of the word-line in FIG. 14.

FIG. 16 is a timing diagram illustrating an operation of the word-line in FIG. 14.

Referring to FIGS. 14 through 16, the first word-line enable control signal PXi is a logic low level initially (FIG. 16), then transits to a logic high level VCC at each timing T31 and T33 when the corresponding word-line is to be enabled in response to a row address and transits to a logic low level VSS at each timing T32 and T34 when other word-lines are enabled.

A boosted node voltage signal PXiD is a logic low level initially, then transitions to the boosted voltage VPP at each timing T31 and T33 when first word-line enable control signal PXi transitions to logic high VCC and transitions to the ground voltage at each timing T32 and T34 when first word-line control signal PXi transitions to logic low VSS level.

After a corresponding word line WLi is disabled while the word line enable signal NEWiB is initially maintained at the logic high VCC level, the word line enable signal NEWiB transits to the logic low level VSS at each timing T31 and T33 when the row decoder activates the corresponding word line WLi, and transits to logic low level VSS at each timing T32 and T34 when other word-lines are enabled.

With continued reference to FIG. 16, after the corresponding word line WLi is disabled to the ground voltage while the second word-line control signal PXiB is initially maintained at the high level, the word-line control signal PXiB transits to the low level at each timing T31 and T33 the corresponding word line WLi is enabled. As shown in FIG. 16, when other word-lines are enabled, the second word-line control signal PXiB re-transits to the high level VCC at each timing T32 and T34.

The corresponding word-line WLi is initially maintained at the negative voltage level in response to the second word-line control signal PXiB, and the boost node voltage signal PXiD is delayed for a given time and transferred when the word-line enable signal NEWiB transits to the logic low level at each timing T31 and T33. When other word-lines are activated and the word-line enable bar signal NEWiB transits to the logic high level at each timing T32 and T34, the corresponding word-line signal WLi is disabled to the negative voltage VBB2 in response to the second word-line control signal PXiB. A disabling time point of the word-line WLi may be adjusted by the second word-line control signal PXiB. The word-line control signal generator 430 transits (enables) the second word-line control signal PXiB to disable the word-line with the negative voltage VBB2 in response to a transition (enabling) of the decision signal DS.

Figure 17:
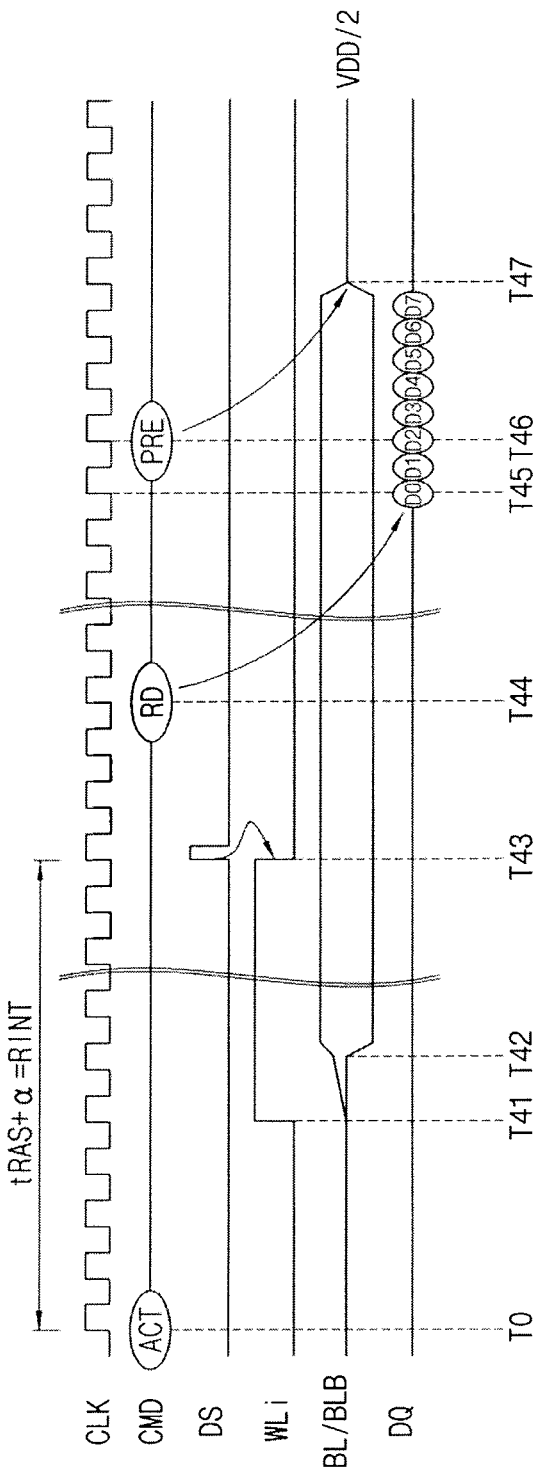
FIG. 17 is a timing diagram illustrating an operation of the semiconductor memory device of FIG. 3 according to exemplary embodiments of the inventive concept.

FIG. 17 is a timing diagram illustrating an operation of the semiconductor memory device of FIG. 3 according to exemplary embodiments of the inventive concept.

Referring to FIGS. 2 through 17, at T0, the timer 411 activates the time interval signal of a pulsed-shape in response to the active signal ACT corresponding to the active command from the memory controller 100 and the time interval comparator 413 may count toggling of the clock signal CLK from a time point T0 and activates the pulsed-type decision signal DS at a time point T43, at which the toggling number of the clock signal CLK becomes the toggling number of the clock signal CLK in the reference time interval RINT. The reference time interval RINT interval between T0 and T43 may correspond to sum of a row active time tRAS of the semiconductor memory device 200a and a particular time interval a. The row active time tRAS of the semiconductor memory device 200a may be defined as the sum of the time taken for a bit-line sense amplifier to finish a sensing operation in response to a row address after the application of the active command and the time taken to perform a data read or write operation.

As the semiconductor memory device 200 does not receive a successive command from the memory controller 100 during the reference time interval RINT, the word-line control signal generator 430 transits the second word-line control signal PXiB with a low level in response to an activation of the decision signal DS, and the sub word-line driver 550 disables the word-line WLi with the negative voltage VBB2 level in response to a transition of the second word-line control signal PXiB.

At a time point T41, the sub word-line driver 550 enables the word-line WLi with the boosted voltage VPP level in response to the active command and at a time point T42, the bit-line sense amplifier 650 charges a first bit-line of a bit-line pair BL and BLB with a power supply voltage VDD and discharges a second bit-line of the bit-line pair BL and BLB to the ground voltage VSS. When the semiconductor memory device 200a receives a read command (RD) from the memory controller 100 at a time point T44, data bits D0~D7 are read from the memory cell array 300 from a time point T45 after a read latency from the time point T44.

At time point T46, when the semiconductor memory device 200a receives a pre-charge command (PRE) (or a pre-charge signal PRC) from the memory controller 100, the bit-line pair BL and BLB are pre-charged to a pre-charge voltage VDD/2. As the command comprises a read command after the time point T44, the bit-line sense amplifier 650 maintains the bit-line pair BL and BLB at a sensing state in which the first bit-line of a bit-line pair BL and BLB is charged with the power supply voltage VDD and the second bit-line of the bit-line pair BL and BLB is discharged to the ground voltage VSS.

Figure 18A:
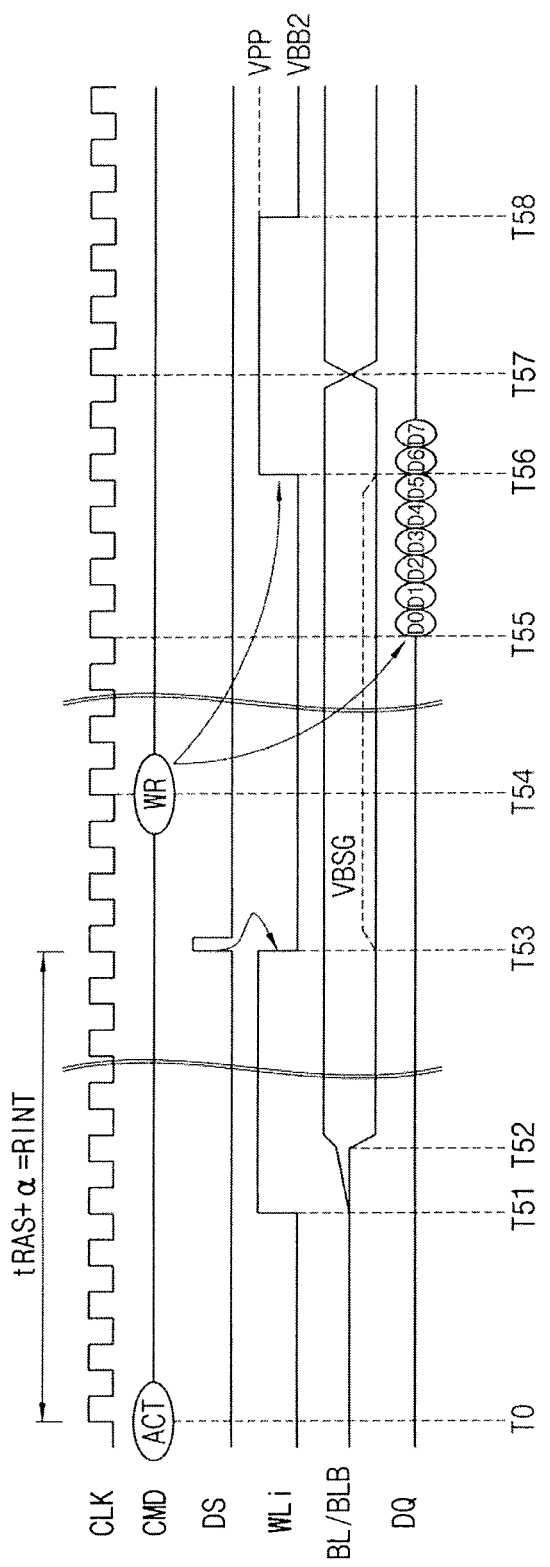
FIG. 18A is a timing diagram illustrating an operation of the semiconductor memory device of FIG. 3 according to exemplary embodiments of the inventive concept.

FIG. 18A is a timing diagram illustrating an operation of the semiconductor memory device of FIG. 3 according to exemplary embodiments of the inventive concept.

Referring to FIGS. 2 through 16 and 18A, at T0, the timer 411 activates the time interval signal of a pulsed-shape in response to the active signal ACT corresponding to the active command from the memory controller 100 and the time interval comparator 413 counts toggling of the clock signal CLK from a time point T0 and activates the pulsed-type decision signal DS at a time point T53 at which the toggling number of the clock signal CLK becomes the toggling number of the clock signal CLK in the reference time interval RINT.

Since the semiconductor memory device 200a does not receive a successive command from the memory controller 100 during the reference time interval RINT, the word-line control signal generator 430 transits the second word-line control signal PXiB with a low level in response to an activation of the decision signal DS, and the sub word-line driver 550 disables the word-line WLi with the negative voltage VBB2 level in response to a transition of the second word-line control signal PXiB.

At a time point T51, it is shown in FIG. 18A that the sub word-line driver 550 enables the word-line WLi with the boosted voltage VPP level in response to the active command and at a time point T52, the bit-line sense amplifier 650 charges a first bit-line of a bit-line pair BL and BLB with a power supply voltage VDD and discharges a second bit-line of the bit-line pair BL and BLB to the ground voltage VSS. At T54, when the semiconductor memory device 200a receives a write command from the memory controller 100, data bits D0~D7 are input from a time point T55. The sub word-line driver 550 enables the word-line WLi with the boosted voltage VPP between T56 and T58, and disables the word-line WLi to the negative voltage VBB2 after the time point T58.

The bit-line sense amplifier 650 may invert the voltage levels of the bit-line pair BL and BLB at the time point T57 for writing the data bits D0~D7. The bit-line sense amplifier 650 discharges the second bit-line to the ground voltage VSS or maintains the second bit-line voltage at the boosted sense ground voltage VBSG between T53 and T56 during which the word-line WLi is disabled.

Figure 18B:
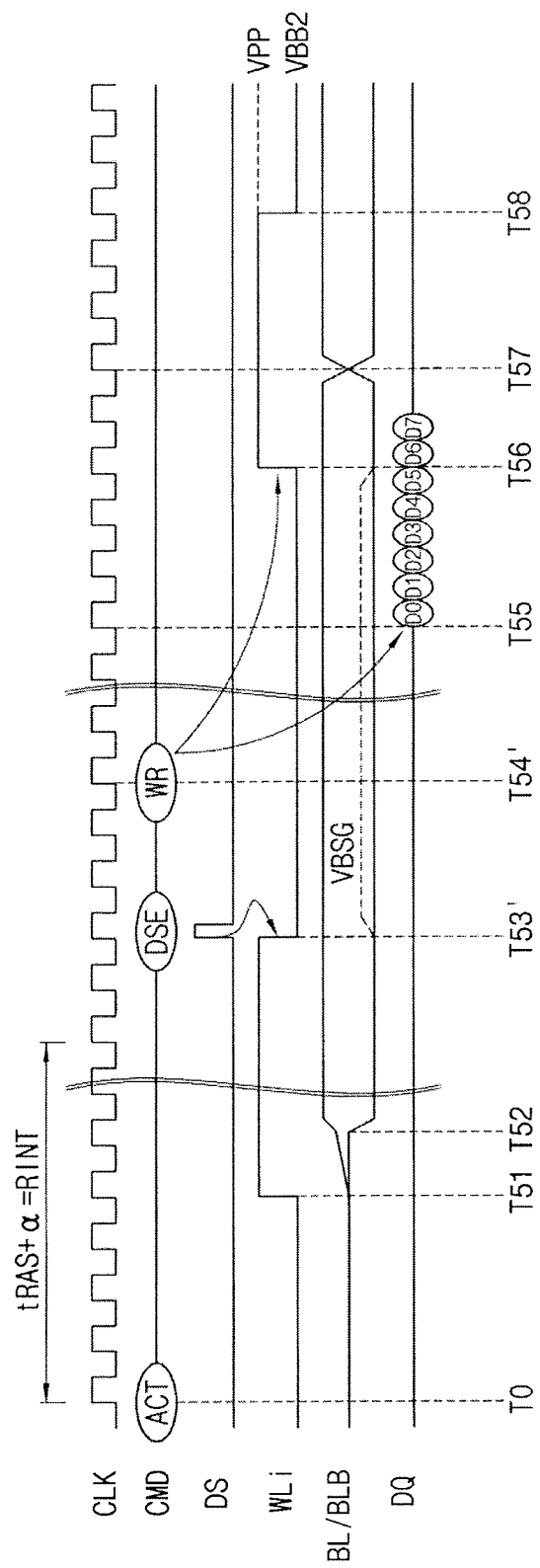
FIG. 18B is another timing diagram illustrating an operation of the semiconductor memory device of FIG. 3 according to exemplary embodiments of the inventive concept.

FIG. 18B is another timing diagram illustrating an operation of the semiconductor memory device of FIG. 3 according to exemplary embodiments of the inventive concept.

The timing diagram of FIG. 18B is different from the timing diagram of FIG. 18A, as timing points T53' and T34' replace the timing points T53 and T54.

Referring to FIGS. 2 through 16 and 18B, in response to a determination that the semiconductor memory device 200a did not receive the write command from the memory controller 100 during the reference time interval RINT after receiving the active command (ACT), the memory controller 100 applies the disable command corresponding to the disable signal DSE to the semiconductor memory device 200a at a time point T53', the time interval comparator 413 activates the pulsed-shape decision signal DS in response to the memory controller applying the disable signal DSE. The word-line control signal generator 430 transits the second word-line control signal PXiB to a low level in response to activation of the decision signal DS, and the sub word-line driver SWD 550 disables the word-line WLi with the negative voltage VBB2 level in response to transition of the second word-line control signal PXiB at the time point T53'. The semiconductor memory device 200a receives the write command from the memory controller 100 at the time point T54'.

Figure 19A:
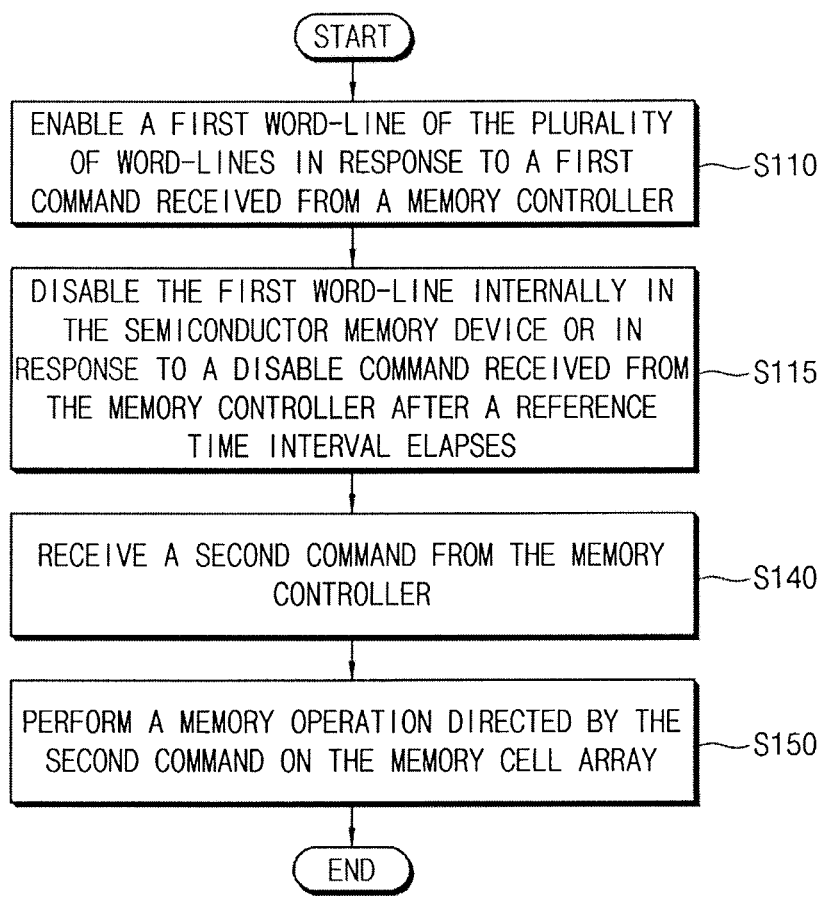
FIG. 19A is a flow chart illustrating a method of operating a semiconductor memory device according to exemplary embodiments of the inventive concept.

FIG. 19A is a flow chart illustrating an example if a method of operating a semiconductor memory device according to exemplary embodiments of the inventive concept.

Referring to FIGS. 2 through 19A, a method of operating a semiconductor memory device 200a including a memory cell array 300 having a plurality of memory cells coupled to a plurality of word-lines and a plurality of bit-lines BL.

At (S110) a first word-line of the plurality of word-lines is enabled in response to a first command received from a memory controller 100. The first word-line may be selected in response to an access address received from the memory controller 100.

At (S115), the first word-line is disabled internally in the semiconductor memory device 200a, or alternatively may be disabled in response to a disable command received from the memory controller 100 after a reference time interval RINT elapses, and the reference time interval RINT starts from a first time point T0 when the first command is applied to the semiconductor memory device 200a. The reference time interval RINT corresponds to a time interval equal to or greater than a row active time (tRAS) interval of the semiconductor memory device 200a.

At (S140), when the first word-line is disabled, the semiconductor memory device 200a receives a second command from the memory controller 100.

At (S150), the semiconductor memory device 200a performs a memory operation directed by the second command. When the second command comprises a read command, the semiconductor memory device 200a reads data bits from memory cells coupled to the first word-line without the timing control circuit 400 enabling the first word-line again. When the second command comprises a write command, the timing control circuit 400 enables the first word-line and data bits are written in memory cells coupled to the first word-line.

Figure 19B:
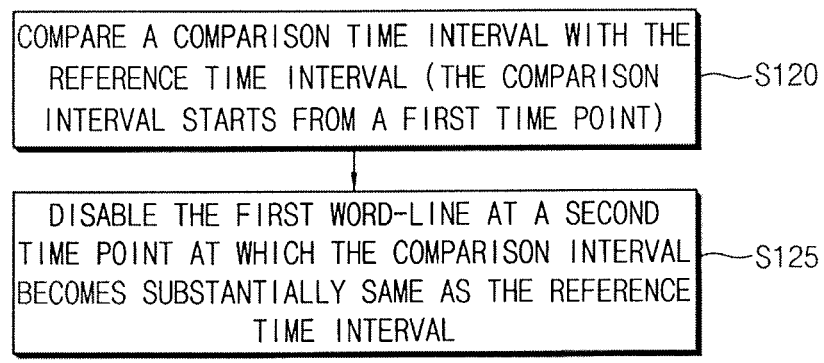
FIG. 19B is a flow chart illustrating an operation of disabling the first word-line according to exemplary embodiments of the inventive concept.

FIG. 19B is a flow chart illustrating more detail regarding the operation of disabling the first word-line in operation (S115) of FIG. 19A, according to exemplary embodiments.

Referring to FIGS. 2 through 19B, one way to disable the first word-line in the semiconductor memory device 200a is by internally disabling the word-line (S115a).

For example, with reference to FIG. 19B, the timer logic 410 compares the comparison interval starting from the first time point T0 with the reference interval RINT (S120). The timer logic 410 disables the first word-line at a second time point T43 or T53 at which the comparison interval becomes substantially same as the reference time interval RINT while a command is not received from the memory controller 100 using the comparison time interval (S125).

Figure 19C:
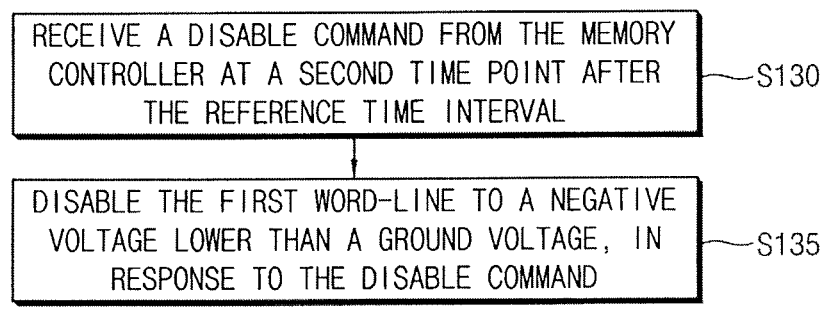
FIG. 19C is a flow chart illustrating an operation of disabling the first word-line according to exemplary embodiments of the inventive concept.

Another way to disable the first word-line in the semiconductor device disclosed in operation (S115) in FIG. 19A is via a disable command (S115b). FIG. 19C is a flow chart illustrating an exemplary operation of disabling the first word-line via the disable command.

Referring to FIGS. 2 through 19A, and 19C, provide another way to disable the first word-line for example, by the semiconductor memory device 200a receiving the disable command from the memory controller 100 at a second time point T53' after the reference time interval RINT (S130).

For example, the CPU 110 in the memory controller 100 controls the command generator 130 to apply the disable command to the semiconductor memory device when a write command does not exist in the command queue 120 during a predetermined time interval starting from a time point at which the active command is applied to the semiconductor memory device 200a.

At (S135), the timer logic 410 activates the decision signal DS in response to the disable signal DSE corresponding to the disable command, and the word-line control signal generator 430 transits the second word-line control signal PXiB to disable the word-line to the negative voltage VBB2.

As discussed herein above, a semiconductor memory device or a method of operating a semiconductor memory device, enables a selected word-line in response to an active command and may internally disable the selected word-line (in which the disablement may be forcibly applied) in the semiconductor memory device, or by a memory controller applying a disable command to the semiconductor memory device when a successive command is not received from the memory controller during a reference time interval. Therefore, the influence of disturbance on adjacent word-lines due to enabling of the selected word-line may be reduced/prevented.

Figure 20:
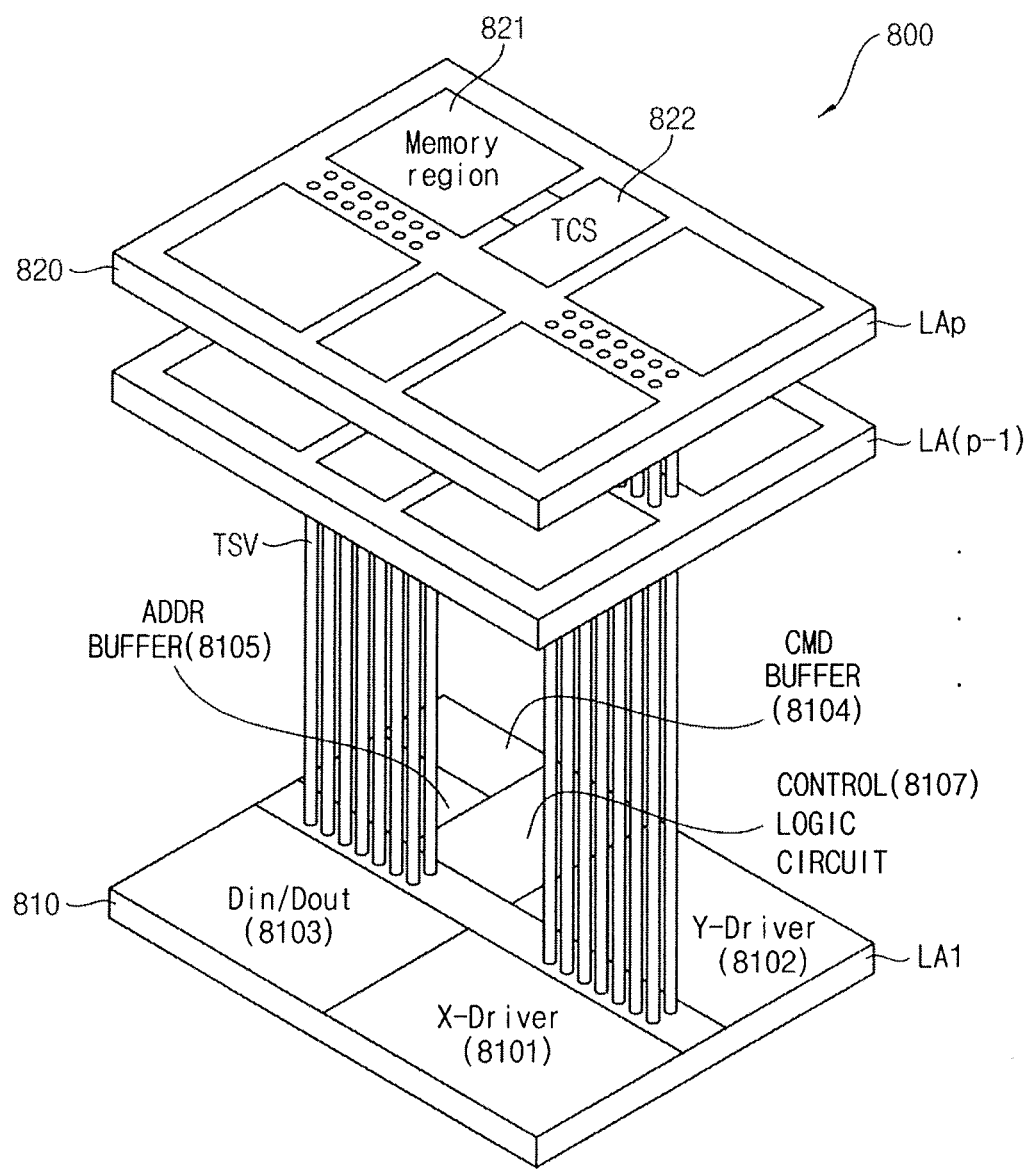
FIG. 20 is a structural diagram illustrating a semiconductor memory device according to exemplary embodiments of the inventive concept.

FIG. 20 is a structural diagram illustrating a semiconductor memory device according to exemplary embodiments of the inventive concept.

Referring to FIG. 20, a semiconductor memory device 800 may include a first through p-th semiconductor integrated circuit layers LA1 through LAp (p is a natural number greater than two), in which the lowest first semiconductor integrated circuit layer LA1 is assumed to be an interface or control chip and the other semiconductor integrated circuit layers LA2 through LAp are assumed to be slave chips including core memory chips. The first through p-th semiconductor integrated circuit layers LA1 through LAp shown in FIG. 20 may transmit and receive signals therebetween through through-silicon-vias (TSVs). The lowest first semiconductor integrated circuit layer LA1 as the interface or control chip may communicate with an external memory controller through a conductive structure formed on an external surface. A description will be made herein regarding structure and an operation of the semiconductor memory device 800 by mainly referring to the first semiconductor integrated circuit layer LA1 or 810 as the interface or control chip and the p-th semiconductor integrated circuit layer LAp or 820 as the slave chip. However, a person of ordinary skill in the art should understand and appreciate that the description is not limited to the layer discussed herein below.

The first semiconductor integrated circuit layer 810 may include various peripheral circuits for driving a memory region 821 provided in the p-th semiconductor integrated circuit layer 820. For example, the first semiconductor integrated circuit layer 810 may include a row (X)-driver 8101 for driving word-lines of a memory, a column (Y)-driver 8102 for driving bit-lines of the memory, a data input/output unit (Din/Dout) 8103 for controlling input/output of data, a command buffer 8104 for receiving a command from outside and buffering the command, and an address buffer 8105 for receiving an address from outside and buffering the address.

The first semiconductor integrated circuit layer 810 may further include a control logic circuit 8107. The control logic circuit 8107 may access the memory region 821 and may generate control signals for accessing the memory region 821 based on the command and address from the memory controller. The p-th semiconductor integrated circuit layer 820 may include the memory region 821 and a timing control circuit 822 and a peripheral region. The timing control circuit 822 controls voltage levels of word-lines and bit-lines coupled to memory cells in the memory region 821. Peripheral circuits such as a row decoder, a column decoder, and a bit-line sense amplifier are disposed for writing/reading data in the memory region 821 are disposed in the peripheral region.

As described with reference to FIGS. 3 through 19C, the semiconductor memory device 800 enables a selected word-line in response to an active command and disables the selected word-line forcibly internally in the semiconductor memory device or by a memory controller applying a disable command to the semiconductor memory device when a successive command is not received from the memory controller during a reference time interval. Therefore, influence of disturbance on adjacent word-lines due to enabling of the selected word-line may be reduced/prevented.

In addition, in some embodiments, a three dimensional (3D) memory array is provided in semiconductor memory device 800. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

Figure 21:
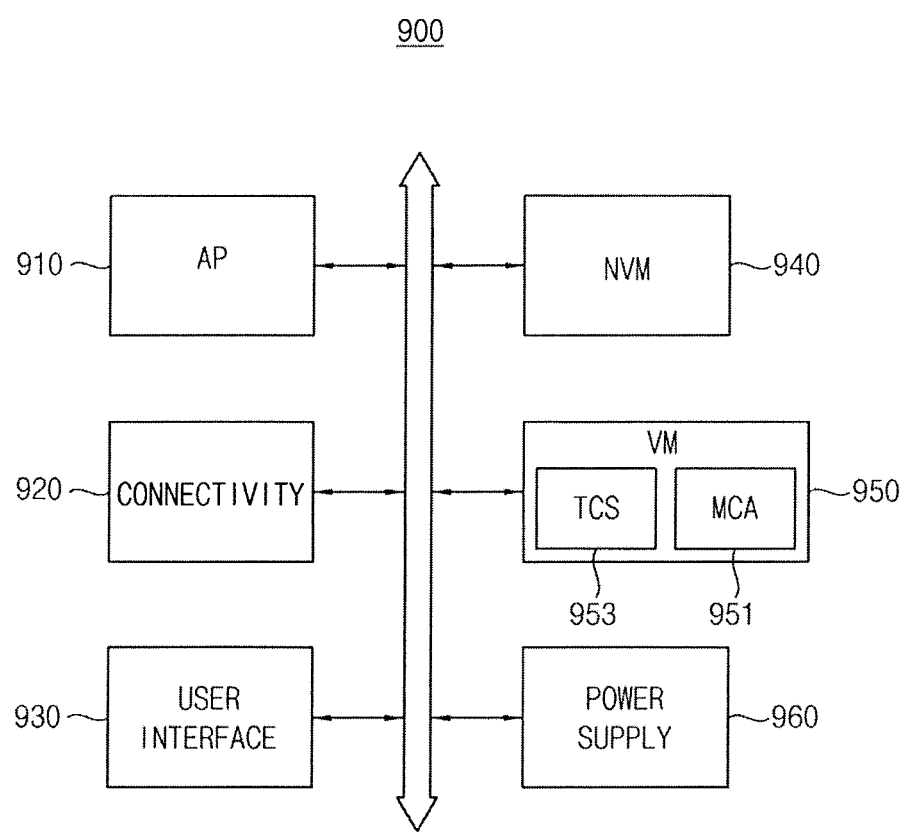
FIG. 21 is a block diagram illustrating a mobile system including the semiconductor memory device according to exemplary embodiments of the inventive concept.

FIG. 21 is a block diagram illustrating a mobile system including the semiconductor memory device according to exemplary embodiments.

Referring to FIG. 21, a mobile system 900 may include an application processor 910, a connectivity unit 920, a volatile memory device 950, a nonvolatile memory device 940, a user interface 930 and a power supply 960. The application processor may include a memory controller.

The application processor 910 may execute applications, such as a web browser, a game application, a video player, etc. The connectivity unit 920 may perform wired or wireless communication with an external device. The semiconductor memory device 950 may store data processed by the application processor 910 or operate as a working memory. The volatile memory device 950 may employ the semiconductor memory device 200a of FIG. 3. The volatile memory device 950 includes a memory cell array 951 memory cells and a timing control circuit 953.

The nonvolatile memory device 940 may store a boot image for booting the mobile device 900. The user interface 930 may include at least one input device, such as a keypad, a touch screen, etc., and at least one output device, such as a speaker, a display device, etc. The power supply 960 may supply a power supply voltage to the mobile system 900.

As mentioned above, the volatile memory device 950 enables a selected word-line in response to an active command and disables the selected word-line forcibly internally in the semiconductor memory device or by a memory controller applying a disable command to the semiconductor memory device when a successive command is not received from the memory controller during a reference time interval. Therefore, influence of disturbance on adjacent word-lines due to enabling of the selected word-line may be reduced/prevented.

The present disclosure may be applied to systems using semiconductor memory devices. The present disclosure may be applied to systems such as be a mobile phone, a smart phone, a personal digital assistant (PDA), a portable multimedia player (PMP), etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present disclosure as defined in the claims.

What is claimed is:

1. A method of operating a semiconductor memory device including a memory cell array having a plurality of memory cells coupled to a plurality of word-lines and a plurality of bit-lines, the method comprising:
   enabling a first word-line of the plurality of word-lines in response to a first command received from a memory controller, the first word-line being selected in response to an access address received from the memory controller;
   generating an interval signal having a first pulse width if the first command corresponds to an active command; and
   counting the generated interval signal to determine whether a reference time interval has elapsed, and disabling the first word-line upon determining the reference time interval has elapsed,
   wherein a first bit-line of a bit-line pair coupled to at least one memory cell coupled to the first word-line is charged with an internal voltage and a second bit-line of the bit-line pair is discharged to a ground voltage in an enable interval during which the first word-line is enabled, and
   wherein voltage levels of the first and second bit-lines are maintained at the internal voltage and the ground voltage, respectively, during a disable interval during which the first word-line is disabled.

2. The method of claim 1, wherein the first word-line is disabled upon determining the reference time interval has elapsed and upon determining that a second command is not received from the memory controller during the reference time interval.

3. The method of claim 2, wherein the counting of the generated interval signal is performed by timer logic counting toggling of a clock signal received from the memory controller during a comparison time interval, and wherein a sub word-line driver is configured to disable the first word-line by applying a negative voltage having a level lower than a ground voltage to the first word-line, and wherein the sub word-line driver is connected to the first word-line.

4. The method of claim 1, further comprising disabling the first word-line in response to a disable command, wherein the memory controller is configured to apply the disable command to the semiconductor memory device when a write command to be applied to the semiconductor memory device is not present in a command queue in the memory controller during a predetermined time interval after the active command is applied to the first word-line.

5. The method of claim 1, further comprising:
   receiving a second command from the memory controller during the disable interval during which the first word-line is disabled; and
   performing a memory operation directed by the second command on the memory cell array.

6. The method of claim 5, wherein when the second command comprises a write command to direct a write operation on the memory cell array, the method further comprises:
   enabling the first word-line with a boosted voltage level; and
   writing data received from the memory controller to memory cells coupled to the first word-line in response to the write command,
   wherein the first bit-line is pre-charged with the internal voltage and the second bit-line is maintained at a boosted sense voltage greater than the ground voltage during the disable interval, and
   wherein the first bit-line is maintained at the internal voltage and the second bit-line is discharged to the ground voltage during an enable interval during which the first word-line is enabled with the boosted voltage level.

7. The method of claim 5, wherein when the second command comprises the read command to direct a read operation on the memory cell array, the method further comprises: reading data from memory cells coupled to the first word-line in response to the read command.

8. A semiconductor memory device comprising:
   a memory cell array including a plurality of memory cells coupled to a plurality of word-lines and a plurality of bit-lines;
   a control logic circuit configured to control access to the memory cell array; and
   a timing control circuit configured to:
      generate first control signals to control voltage levels of the word-lines in response to operation control signals provided from the control logic circuit;
      enable a first word-line of the plurality of word-lines in response to a first command received from a memory controller, the first word-line being selected in response to an access address received from the memory controller;
      generate an interval signal having a first pulse width if the first command corresponds to an active command;
      count the generated interval signal to determine whether a reference time interval has elapsed, and disable the first word-line upon determining the reference time interval has elapsed,
   wherein a first bit-line of a bit-line pair coupled to at least one memory cell coupled to the first word-line is charged with an internal voltage and a second bit-line of the bit-line pair is discharged to a ground voltage in an enable interval during which the first word-line is enabled, and
   wherein voltage levels of the first and second bit-lines are maintained at the internal voltage and the ground voltage, respectively, during a disable interval during which the first word-line is disabled.

9. The semiconductor memory device of claim 8, wherein the timing control circuit disables the first word-line by application of a negative voltage having a value lower than the ground voltage to the first word-line.

10. The semiconductor memory device of claim 8, wherein the first word-line is disabled upon a determination that the reference time interval has elapsed and upon a determination that a second command is not received from the memory controller during the reference time interval.

11. The semiconductor memory device of claim 10, wherein the count of the interval signal is based on a count of toggling of a clock signal received from the memory controller during the reference time interval.

12. The semiconductor memory device of claim 8, wherein the timing control circuit is further configured to generate second control signals to control voltage levels of a bit-line pair coupled to at least one memory cell coupled to the first word-line, and wherein the timing control circuit comprises:
   a timer logic configured to receive the operation control signals, configured to compare a duration time interval after a first operation control signal is applied with the reference time interval and configured to generate a decision signal which is activated at a time point at which the duration time interval becomes substantially the same as the reference time interval, wherein the first operation control signal corresponds to the first command; and a word-line control signal generator configured to generate first and second word-line control signals to control a voltage level of the first word-line, in response to a decoded address which is decoded from the access address and the decision signal.

13. The semiconductor memory device of claim 12, further comprising a sub word-line driver connected to the first word-line, wherein the sub word-line driver is configured to provide a negative voltage to the first word-line to disable the first word-line in response to a transition of the second word-line control signal, and wherein the word-line control signal generator is configured to transit the second word-line control signal in response to a transition of the decision signal.

14. The semiconductor memory device of claim 12, wherein when a second command comprises a write command to direct a write operation on the memory cell array and the second command is received from the memory controller during the disable interval during which the first word-line is disabled, the control logic circuit is configured to control the timing control logic to enable the first word-line with a boosted voltage level and the control logic circuit is configured to write data received from the memory controller to memory cells coupled to the first word-line.

15. The semiconductor memory device of claim 14, wherein the timing control circuit is configured to:

charge the first bit-line of a bit-line pair with the internal voltage and maintain a voltage of the second bit-line at a boosted sense voltage greater than the ground voltage during a disable interval during which the first word-line is disabled, wherein the bit-line pair is coupled to at least one memory cell coupled to the first word-line; and maintain a voltage of the first bit-line at the internal voltage and discharge the second bit-line with the ground voltage during an enable interval when the first word-line is enabled with the boosted voltage level.

16. The semiconductor memory device of claim 12, wherein when a second command comprises a read command to direct a read operation on the memory cell array during the disable interval during which the first word-line is disabled, the control logic circuit is configured to control the timing control circuit to maintain the first word-line at a negative voltage and the control logic circuit is configured to read data from memory cells coupled to the first word-line, and wherein the memory cell array comprises a three-dimensional memory cell array.

17. A method of operating a semiconductor memory device including a memory cell array having a plurality of memory cells coupled to a plurality of word-lines and a plurality of bit-lines, the method comprising:

enabling a first word-line of the plurality of word-lines in response to a first command received from a memory controller, the first word-line being selected in response to an access address received from the memory controller; and disabling the first word-line after a reference time interval elapses, wherein the reference time interval starts from a first time point when the first command is applied to the semiconductor memory device, wherein the reference time interval corresponds to a time interval equal to or greater than a row active time (tRAS) interval of the semiconductor memory device, wherein a first bit-line of a bit-line pair coupled to at least one memory cell coupled to the first word-line is charged with an internal voltage and a second bit-line of the bit-line pair is discharged to a ground voltage in an enable interval during which the first word-line is enabled, and wherein voltage levels of the first and second bit-lines are maintained at the internal voltage and the ground voltage, respectively, during a disable interval during which the first word-line is disabled.

18. The method of claim 17, the first word-line is disabled by application of a negative voltage having a value lower than a ground voltage to the first word-line.

\* \* \* \* \*